(12) United States Patent
Jo et al.

(10) Patent No.: US 10,658,249 B2
(45) Date of Patent: May 19, 2020

(54) METHODS FOR FABRICATING FINFET DEVICES HAVING GATE SPACERS ON FIELD INSULATING LAYERS

(71) Applicant: Samsung Electronics Co., Ltd., Suwon-si, Gyeonggi-do (KR)

(72) Inventors: Gun Ho Jo, Seoul (KR); Dae Joung Kim, Suwon-si (KR); Jae Mun Kim, Seoul (KR); Moon Han Park, Yongin-si (KR); Tae Ho Cha, Yongin-si (KR); Jae Jong Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/170,842

(22) Filed: Oct. 25, 2018

(65) Prior Publication Data

US 2019/0148521 A1  May 16, 2019

(30) Foreign Application Priority Data

Nov. 16, 2017 (KR) .................. 10-2017-0152979

(51) Int. Cl.
*H01L 21/8238* (2006.01)
*H01L 29/66* (2006.01)
(Continued)

(52) U.S. Cl.
CPC .. *H01L 21/823821* (2013.01); *H01L 21/0214* (2013.01); *H01L 21/0217* (2013.01); *H01L 21/02247* (2013.01); *H01L 21/823431* (2013.01); *H01L 21/845* (2013.01); *H01L 29/42392* (2013.01); *H01L 29/66439* (2013.01); *H01L 29/66545* (2013.01); *H01L 29/66795* (2013.01); *H01L 29/785* (2013.01); *H01L 29/7848* (2013.01); *H01L 29/78696* (2013.01)

(58) Field of Classification Search
CPC ........... H01L 21/02247; H01L 21/0217; H01L 21/0214; H01L 21/823431; H01L 21/823821; H01L 21/845
See application file for complete search history.

(56) References Cited

U.S. PATENT DOCUMENTS 8,049,286 B2   11/2011   Tateshita
8,441,072 B2   5/2013   Tsai et al.
(Continued)

*Primary Examiner* — Michael Jung
(74) *Attorney, Agent, or Firm* — Harness, Dickey & Pierce, P.L.C.

(57) ABSTRACT

A method for fabricating a semiconductor device includes forming a fin type pattern protruding from a substrate and extending in a first direction, forming a field insulating layer covering a limited portion of the fin type pattern on the substrate such that the field insulating layer exposes a separate limited portion of the fin type pattern, forming a gate structure on the field insulating layer and the fin type pattern, the gate structure extending in a second direction, the second direction different from the first direction, forming a first barrier layer containing a nitrogen element in a first region of the field insulating layer, wherein the first region is exposed by the gate structure, adjacent to the gate structure and extending in the second direction and forming a gate spacer on the first barrier layer and on a side wall of the gate structure.

16 Claims, 23 Drawing Sheets

(51) Int. Cl.

| | | |
|---|---|---|
| *H01L 21/02* | (2006.01) | |
| *H01L 29/786* | (2006.01) | |
| *H01L 29/78* | (2006.01) | |
| *H01L 29/423* | (2006.01) | |
| *H01L 21/84* | (2006.01) | |
| *H01L 21/8234* | (2006.01) | |

(56) References Cited

U.S. PATENT DOCUMENTS

| | | |
|---|---|---|
| 8,912,063 B2 | 12/2014 | Kim et al. |
| 9,478,660 B2 | 10/2016 | Jangjian et al. |
| 9,570,555 B1 | 2/2017 | Pranatharthiharan et al. |
| 9,691,900 B2 | 6/2017 | Cheng et al. |
| 2014/0273530 A1 | 9/2014 | Nguyen et al. |
| 2016/0351570 A1* | 12/2016 | Park .................... H01L 27/0924 |
| 2016/0359008 A1* | 12/2016 | Choi ................. H01L 29/41791 |
| 2017/0025514 A1 | 1/2017 | Wu et al. |
| 2017/0025536 A1 | 1/2017 | Liang et al. |
| 2017/0222000 A1 | 8/2017 | Chi et al. |

\* cited by examiner

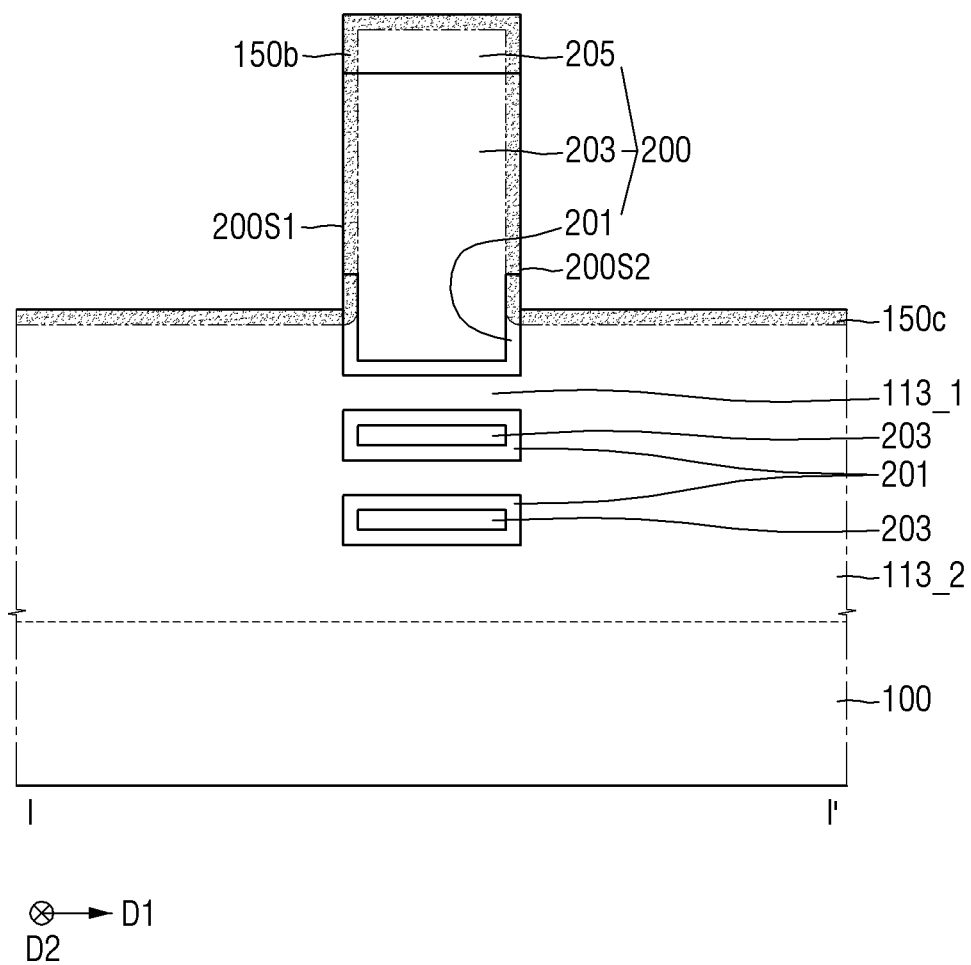

METHODS FOR FABRICATING FINFET DEVICES HAVING GATE SPACERS ON FIELD INSULATING LAYERS

This application claims priority, under 35 U.S.C. § 119, from Korean Patent Application No. 10-2017-0152979 filed on Nov. 16, 2017 in the Korean Intellectual Property Office, the disclosure of which is incorporated herein by reference in its entirety.

BACKGROUND

1. Field of the Disclosure

The present disclosure relates to semiconductor devices and methods for fabricating the same.

2. Description of the Related Art

Recently, semiconductor devices have become smaller with greater performance. Accordingly, even small structural difference in a transistor included in a semiconductor device results in great influence on the performance of the semiconductor device. Previously, a transistor included a polysilicon gate electrode. To meet performance requirements, such a polysilicon gate electrode may be being replaced by a metal gate electrode. To produce a metal gate, the "gate last process" or "replacement gate process" may be used.

SUMMARY

Aspects of the present disclosure provide a semiconductor device with improved performance and yield by forming a barrier layer, and a method for fabricating the same.

This and other aspects, embodiments and advantages of the present disclosure will become immediately apparent to those of ordinary skill in the art upon review of the Detailed Description and Claims to follow.

According to some example embodiments of the present inventive concepts, a method for fabricating a semiconductor device may include forming a fin type pattern protruding from a substrate and extending in a first direction, forming a field insulating layer covering a limited portion of the fin type pattern on the substrate, such that the field insulating layer exposes a separate limited portion of the fin type pattern, forming a gate structure on the field insulating layer and the fin type pattern, the gate structure extending in a second direction, the second direction different from the first direction, forming a first barrier layer in a first region of the field insulating layer, the first region exposed by the gate structure, the first region is adjacent to the gate structure and extending in the second direction, the first barrier layer including a nitrogen element, and forming a gate spacer on the first barrier layer and on a side wall of the gate structure.

According to some example embodiments of the present inventive concepts, a method for fabricating a semiconductor device may include forming a fin type pattern protruding from a substrate and extending in a first direction, forming a field insulating layer covering a limited portion of the fin type pattern on the substrate, such that the field insulating layer exposes a separate limited portion of the fin type pattern, forming a gate structure on the field insulating layer and the fin type pattern, the gate structure extending in a second direction, the second direction different from the first direction, and forming a gate spacer on the field insulating layer and a side wall of the gate structure. The field insulating layer may include a first region overlapping with the gate spacer, and the first region of the field insulating layer may include a nitrogen element.

According to some example embodiments of the present inventive concepts, a method for fabricating a semiconductor device may include forming a fin type pattern protruding from a substrate and extending in a first direction, forming a field insulating layer covering a limited portion of the fin type pattern on the substrate, such that the field insulating layer exposes a separate limited portion of the fin type pattern, forming a dummy gate structure on the field insulating layer and the fin type pattern, the dummy gate structure extending in a second direction, the second direction different from the first direction, performing a nitriding process on an upper surface of the field insulating layer, an upper surface of the fin type pattern, a side wall of the fin type pattern, an upper surface of the dummy gate structure and a side wall of the dummy gate structure to form a barrier layer including a nitrogen element, forming a gate spacer on the barrier layer and the side wall of the dummy gate structure, forming a semiconductor pattern on the fin type pattern, and removing the dummy gate structure.

According to some example embodiments of the present inventive concepts, a semiconductor device may include a fin type pattern protruding from a substrate and extending in a first direction, a field insulating layer covering at least a part of the fin type pattern on the substrate, a gate structure on the field insulating layer and the fin type pattern, the gate structure extending in a second direction, the second direction different from the first direction, and a gate spacer on a side wall of the gate structure. The field insulating layer may include a first region overlapping with the gate spacer, and an upper portion of the field insulating layer in the first region of the field insulating layer contains a nitrogen element.

BRIEF DESCRIPTION OF THE DRAWINGS

The above and other aspects and features of the present disclosure will become more apparent by describing in detail example embodiments thereof with reference to the attached drawings, in which:

FIGS. 4, 5, 6, 7, 8, 9, 10, 11, 12, 13, 14, 15, 16, 17, 18, 19, 20, 21, 22, and 23 are cross-sectional views for illustrating processing steps of methods for fabricating a semiconductor device according to some example embodiments of the present disclosure.

DETAILED DESCRIPTION OF THE EMBODIMENTS

Although the drawings relating to the semiconductor devices according to some example embodiments of the present disclosure illustratively show a fin-type transistor (FinFET) including a channel region of a fin-shaped pattern, this is merely illustrative. It is to be understood that the semiconductor devices according to some example embodiments of the present disclosure may include a tunneling FET, a transistor including a nanowire, a transistor including a nanosheet, or a three-dimensional (3D) transistor. In addition, the semiconductor devices according to some example embodiments of the present disclosure may include a bipolar junction transistor, a lateral double diffusion transistor (LDMOS), and the like.

Although a semiconductor device according to some example embodiments of the present disclosure is described as a multi-channel transistor using fin type patterns, it is to be understood that a planar transistor may also be employed.

Hereinafter, a semiconductor device according to some example embodiments of the present disclosure will be described with reference to FIGS. 1 to 3.

Figure 1:
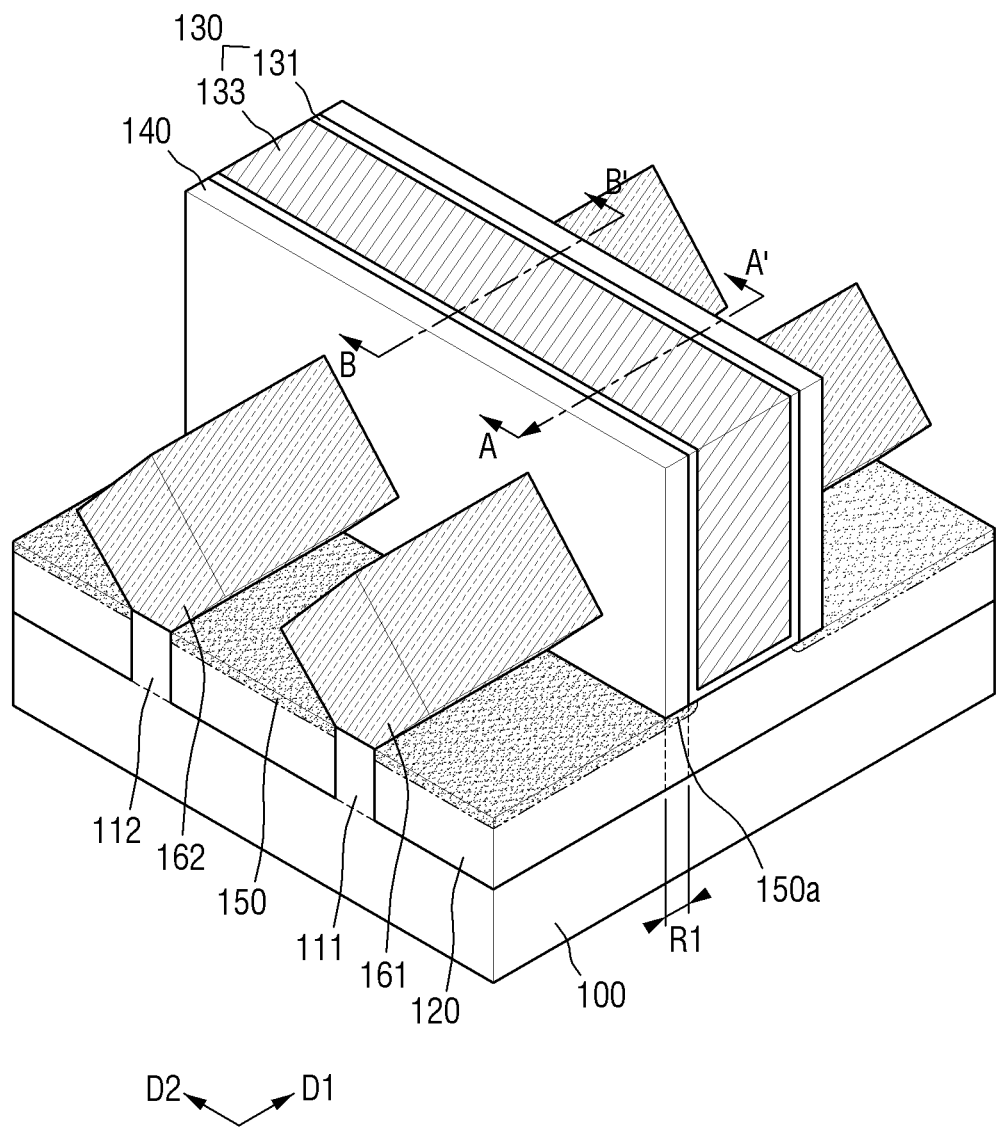
FIG. 1 is a perspective view of a semiconductor device according to some example embodiments of the present disclosure.

FIG. 1 is a perspective view of a semiconductor device according to some example embodiments of the present disclosure. FIG. 2 is a cross-sectional view taken along line A-A' of FIG. 1. FIG. 3 is a cross-sectional view taken along line B-B' of FIG. 1. For convenience of illustration, an interlayer insulating layer 170 is not shown in FIG. 1.

Figure 2:
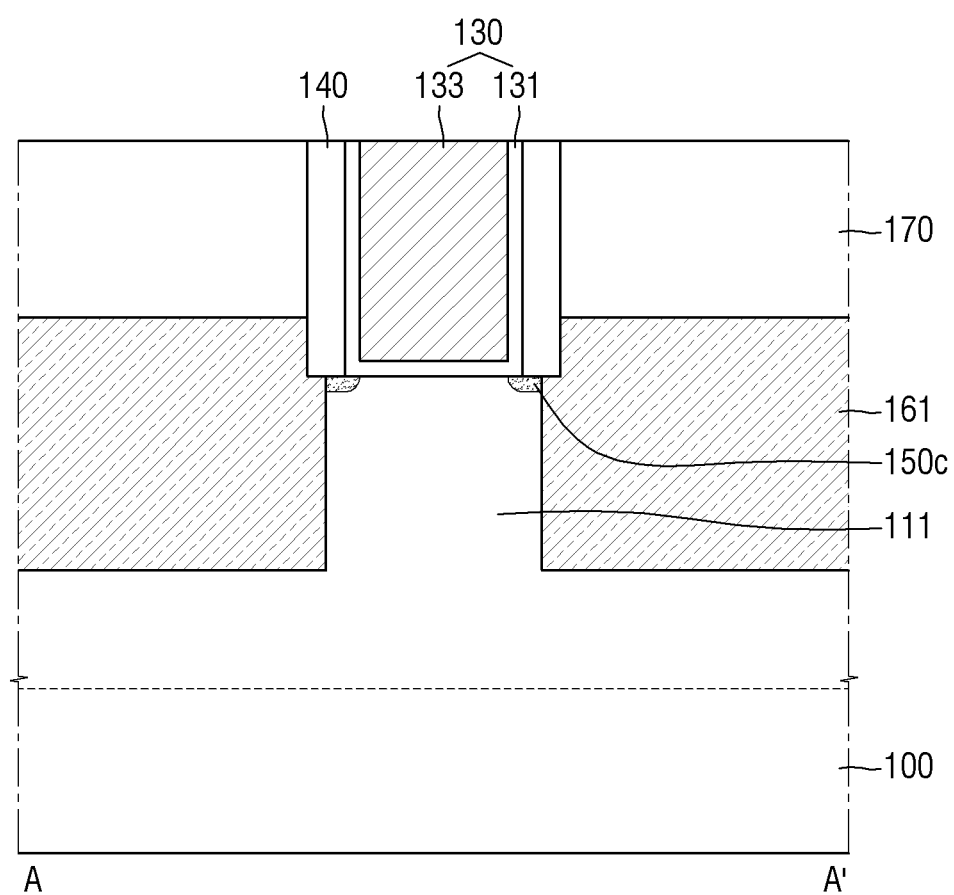
FIG. 2 is a cross-sectional view taken along line A-A' of FIG. 1.
Figure 3:
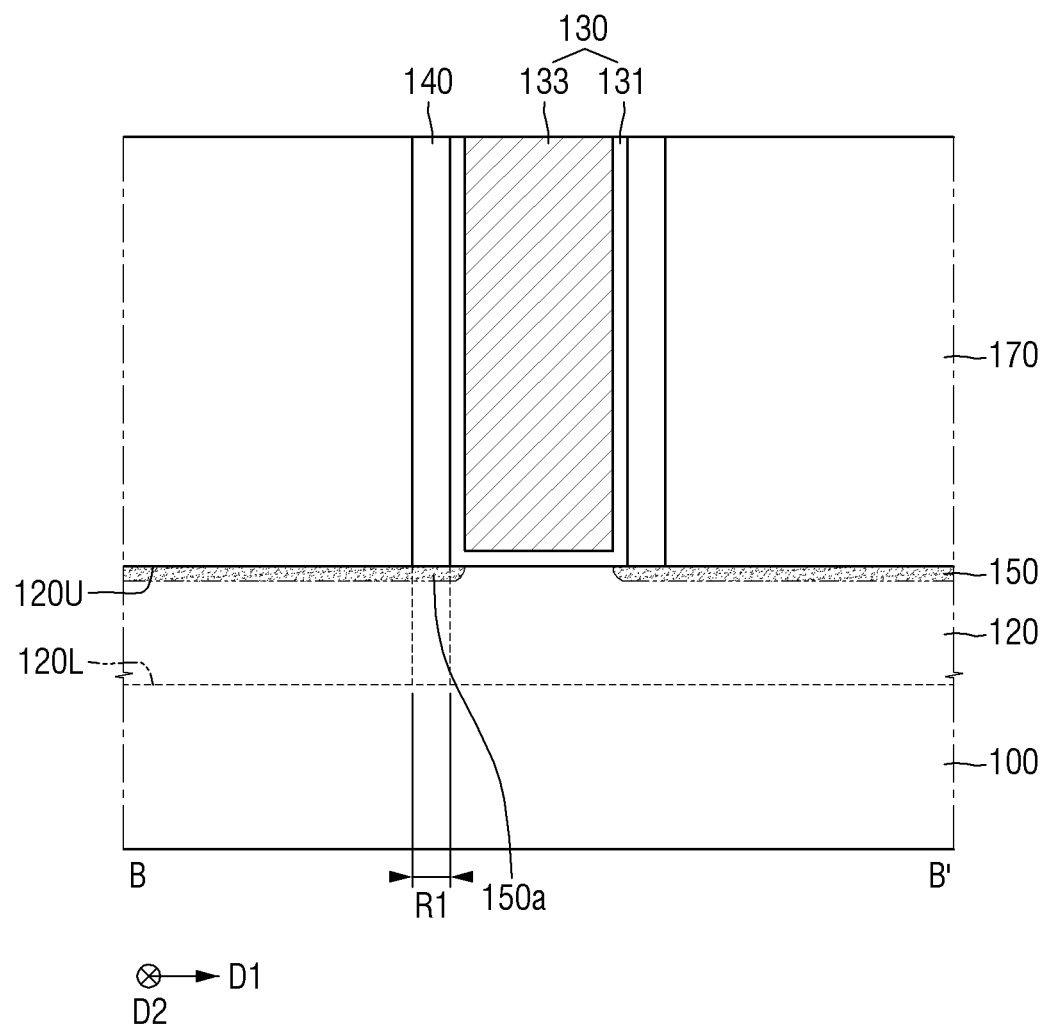
FIG. 3 is a cross-sectional view taken along line B-B' of FIG. 1.

Referring to FIGS. 1 to 3, a semiconductor device according to some example embodiments of the present disclosure may include a substrate 100, a first fin type pattern 111, a second fin type pattern 112, a field insulating layer 120, a first gate structure 130, gate spacers 140, a barrier layer 150, a first semiconductor pattern feature 161, and a second semiconductor pattern feature 162.

The substrate 100 may be, for example, a bulk silicon substrate or a SOI (silicon-on-insulator) substrate. In some example embodiments, the substrate 100 may be a silicon substrate or may be a substrate made of other materials, such as silicon germanium (SiGe), indium antimonide (InSb), lead-telluride (PbTe) compound, indium arsenide (InAs), indium phosphide (InP), gallium arsenide (GaAs) and gallium antimonide (GaSb). In some example embodiments, the substrate 100 may be formed by growing an epitaxial layer on a base substrate.

The first fin type pattern 111 and the second fin type pattern 112 may protrude from the substrate 100 and extend in a first direction D1. The first fin type pattern 111 and the second fin type pattern 112 may be spaced apart from each other in a second direction D2. The first direction D1 and the second direction D2 may intersect with each other.

In the following drawings, the sidewalls of each of the first and second fin type patterns 111 and 112 are shown as being orthogonal. It is, however, to be understood that this is merely illustrative. For example, the sidewalls of each of the first fin type pattern 111 and the second fin type pattern 112 may be inclined. In addition, for example, the first fin type pattern 111 and the second fin type pattern 112 may be in a tapered shape.

The first fin type pattern 111 and the second fin type pattern 112 may be formed by using an epitaxial layer formed on the base substrate. The epitaxial layer may include silicon or germanium, which is an element semiconductor material. In some example embodiments, the epitaxial layer may include a compound semiconductor, for example, a group IV-IV compound semiconductor or a group III-V compound semiconductor. Specifically, as examples of the group IV-IV compound semiconductor, an epitaxial layer may include a binary compound or a ternary compound containing at least two of carbon (C), silicon (Si), germanium (Ge) and tin (Sn), or such a compound doped with a group IV element. As examples of the group III-V compound semiconductor, the epitaxial layer may include a binary compound, a ternary compound or a quaternary compound consisting of at least one of aluminum (Al), gallium (Ga) and indium (In) as the group III element and one of phosphorous (P), arsenic (As) and antimony (Sb) as the group V element.

In a semiconductor device according to some example embodiments of the present disclosure, the first fin type pattern 111 and the second fin type pattern 112 are described as including silicon.

The field insulating layer 120 may be formed on the substrate 100. The field insulating layer 120 may cover at least a portion of each of the first and second fin type patterns 111 and 112. When the field insulating layer 120 covers a portion of each of the first fin type pattern 111 and the second fin type pattern 112, each of the first fin type pattern 111 and the second fin type pattern 112 may protrude above the field insulating layer 120 formed on the substrate 100.

The field insulating layer 120 may include, for example, at least one of a silicon oxide film, a silicon nitride film and a silicon oxynitride film.

The first gate structure 130 may be disposed such that it intersects with each of the first fin type pattern 111 and the second fin type pattern 112. For example, the first gate structure 130 may extend in the second direction D2 on the field insulating layer 120, the first fin type pattern 111, and the second fin type pattern 112.

The first gate structure 130 may include a first gate insulating layer 131 and a first gate electrode 133.

The first gate electrode 133 may include a metal material. Although the first gate electrode 133 is shown as a single layer in the drawings, this is merely illustrative. For example, the first gate electrode 133 may include two or more metal layers. When the first gate electrode 133 includes two or more metal layers, one of the two or more metal layers can control the work function.

The first gate insulating layer 131 may be disposed between the gate spacers 140 and the first gate electrode 133, between the first fin type pattern 111 and the first gate electrode 133, and between the second fin type pattern 112 and the first gate electrode 133. The first gate insulating layer 131 may also be disposed between the field insulating layer 120 and the first gate electrode 133.

The first gate insulating layer 131 may include a high-k material having a dielectric constant higher than that of the silicon oxide layer. For example, the first gate insulating layer 131 may include, but is not limited to, at least one of: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate spacers 140 may be disposed on both sidewalls of the first gate structure 130 extending in the second direction D2. Although the gate spacers 140 are shown as single layers, this is merely illustrative. It is to be understood that the gate spacers 140 may have a multi-layered structure.

The gate spacer 140 may include at least one of silicon nitride (SiN), silicon oxynitride (SiON), silicon oxide (SiO2), silicon oxycarbonitride (SiOCN), and a combination thereof.

The first semiconductor pattern feature 161 may be disposed on the first fin type pattern 111 on at least one side of the first gate structure 130. The second semiconductor pattern feature 162 may be disposed on the second fin type pattern 112 on at least one side of the first gate structure 130. The outer peripheral surfaces of the first semiconductor pattern feature 161 and the second semiconductor pattern feature 162 may have various shapes. For example, the outer peripheral surfaces of the first semiconductor pattern feature 161 and the second semiconductor pattern feature 162 may have various shapes such as a diamond shape, a circular shape, and a rectangular shape. In the following drawings, the semiconductor pattern features have a pentagon shape by way of example.

When the semiconductor device according to some example embodiments of the present disclosure is of a PMOS transistor, the first semiconductor pattern feature 161 and the second semiconductor pattern feature 162 may include a compressive-stress material. For example, the compressive-stress material may have a lattice constant larger than that of Si, such as SiGe. The compressive-stress material may improve its mobility of carriers in a channel region by exerting compressive stress to the first fin type pattern 111 and the second fin type pattern 112.

In some example embodiments, when the semiconductor device according to some example embodiments of the present disclosure is of a NMOS transistor, the first semiconductor pattern feature 161 and the second semiconductor pattern feature 162 may be the same material as the first fin type pattern 111 and the second fin type pattern 112 or may be a tensile-stress material. For example, if the first fin type pattern 111 and the second fin type pattern 112 include silicon (Si), the first semiconductor pattern feature 161 and the second semiconductor pattern feature 162 may be silicon or a material having a lattice constant smaller than that of silicon (e.g., SiC).

The barrier layer 150 may be disposed between the field insulating layer 120 and the interlayer insulating layer 170 to be described later. In addition, the barrier layer 150 may be disposed in a region of the field insulating layer 120 (i.e., a first region R1) that overlaps ("vertically overlaps") with the gate spacer 140. In addition, the barrier layer 150 may be disposed on a portion of the first fin type pattern 111 overlapping with the gate spacer 140. In addition, the barrier layer 150 may be disposed on a portion of the second fin type pattern 112 overlapping with the gate spacer 140.

The barrier layer 150 may be at least partially disposed ("formed") in the field insulating layer 120 as the upper surface of the field insulating layer 120. However, the technical idea of the present disclosure is not limited thereto. For example, at least a part of the barrier layer 150 may protrude from the upper surface of the field insulating layer 120.

The barrier layer 150 may be disposed in each of the first fin type pattern 111 and the second fin type pattern 112 as a part of the upper surface of the first fin type pattern 111 and a part of the upper surface of the second fin type pattern 112. The part of the upper surface of the first fin type pattern 111 and the part of the upper surface of the second fin type pattern 112 may be the part of the first fin type pattern 111 overlapping with the gate spacer 140 and the part of the second fin type pattern 112 overlapping with the gate spacer 140.

However, the technical idea of the present disclosure is not limited thereto. For example, it is to be understood that at least a part of the third barrier layer 150c may protrude from the upper surface the first fin type pattern 111 and the upper surface of the second fin type pattern 112.

The barrier layer 150 may include a first barrier layer 150a and a third barrier layer 150c.

The first barrier layer 150a may be a part of the barrier layer 150 disposed in the first region R1 of the field insulating layer 120. The first barrier layer 150a may be disposed at the upper portion of the field insulating layer 120. The upper portion of the field insulating layer 120 may be a portion of the field insulating layer 120 including an upper surface 120U of the field insulating layer 120. The third barrier layer 150c may be a part of the barrier layer 150 disposed in each of the portions of the first and second fin type patterns 111 and 112 that overlap with the gate spacers 140. The third barrier layer 150c may be disposed at the upper portion of the first fin type pattern 111 and at the upper portion of the second fin type pattern 112. The upper portion of the first fin type pattern 111 and the upper portion of the second fin type pattern 112 may be a portion including the upper surface of the first fin type pattern 111 and a portion including the upper surface of the second fin type pattern 112, respectively.

The barrier layer 150 may include a nitrogen element.

Specifically, in the first region R1 of the field insulating layer 120, the upper portion of the field insulating layer 120 may include a nitrogen element. That is, since the first barrier layer 150a is disposed at the upper portion of the field insulating layer 120 in the first region R1 of the field insulating layer 120, the upper portion of the field insulating layer 120 may include the nitrogen element. For example, in the first region R1 of the field insulating layer 120, the concentration of the nitrogen element may decrease from the upper surface 120U to the lower surface 120L of the field insulating layer 120.

In addition, in the region where the first fin type pattern 111 overlaps with the gate spacer 140 and in the region where the second fin type pattern 112 overlaps with the gate spacer 140, the upper portion of the first fin type pattern 111 and the upper portion of the second fin type pattern 112 may include a nitrogen element, respectively. In addition, in the region where the first fin type pattern 111 overlaps with the gate spacer 140 and in the region where the second fin type pattern 112 overlaps with the gate spacer 140, the third barrier layer 150c is disposed in each of the upper portion of the first fin type pattern 111 and the upper portion of the second fin type pattern 112, and accordingly the upper portion of the first fin type pattern 111 and the upper portion of the second fin type pattern 112 may include a nitrogen element. For example, in the region where the first fin type pattern 111 overlaps with the gate spacer 140 and in the region where the second fin type pattern 112 overlaps with the gate spacer 140, the concentration of the nitrogen element decreases from the upper surface to the lower surface of each of the first fin type pattern 111 and the second fin type pattern 112.

The concentration of the nitrogen element will be described in detail below with reference to FIGS. 13 and 15 and the like.

As referred to herein, a "nitrogen element" may include elemental ("atomic") nitrogen, diatomic nitrogen, a nitrogen-containing compound (e.g., a nitride compound, an oxynitride compound, etc.) some combination thereof, or the like.

The interlayer insulating layer 170 may cover the first semiconductor pattern feature 161, the second semiconductor pattern feature 162 and the first gate structure 130 on the barrier layer 150.

The interlayer insulating layer 170 may include at least one of a low-k dielectric material, an oxide film, a nitride film and an oxynitride film. The low-k dielectric material may be made of, for example, flowable oxide (FOX), tonen silazane (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP), plasma enhanced oxide (PEOX), flowable CVD (FCVD) or a combination thereof.

Hereinafter, a method for fabricating a semiconductor device according to some example embodiments of the present disclosure will be described with reference to FIGS. 4 to 18. For clarity of illustration, the redundant description will be omitted.

FIGS. 4 to 18 are views for illustrating processing steps of a method for fabricating a semiconductor device according to some example embodiments of the present disclosure.

Figure 4:
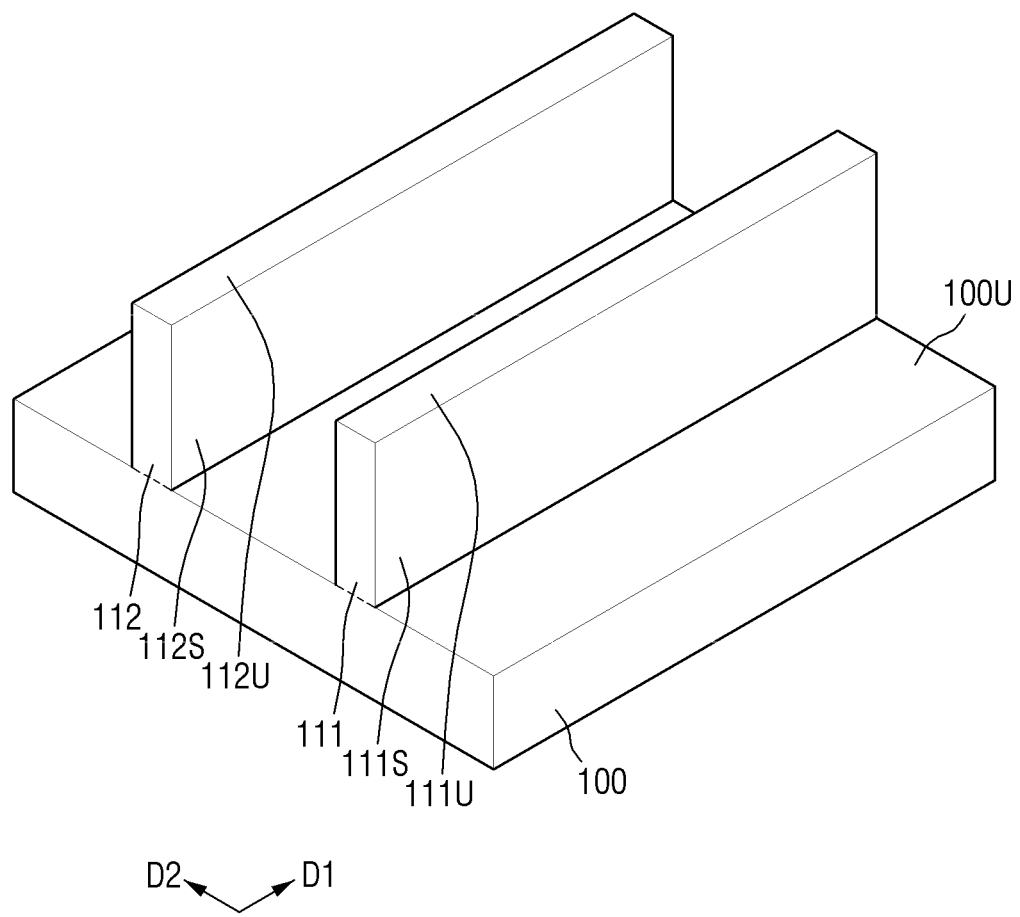

Referring to FIG. 4, a first fin type pattern 111 and a second fin type pattern 112 may be formed.

The first fin type pattern 111 and the second fin type pattern 112 may protrude from the substrate 100 and extend in a first direction D1. The first fin type pattern 111 and the second fin type pattern 112 may be formed, for example, by forming a mask pattern on the substrate 100 and then performing an etching process. A trench may be formed around each of the first fin type pattern 111 and the second fin type pattern 112.

The first fin type pattern 111 may include an upper surface 111U that is higher than the upper surface 100U of the substrate 100. The first fin type pattern 111 may include side walls 111S connecting the upper surface 111U of the first fin type pattern 111 with the upper surface 100U of the substrate 100. The second fin type pattern 112 may include an upper surface 112U that is higher than the upper surface 100U of the substrate 100. The second fin type pattern 112 may include side walls 111S connecting the upper surface 112U of the second fin type pattern 111 with the upper surface 100U of the substrate 100.

Figure 5:
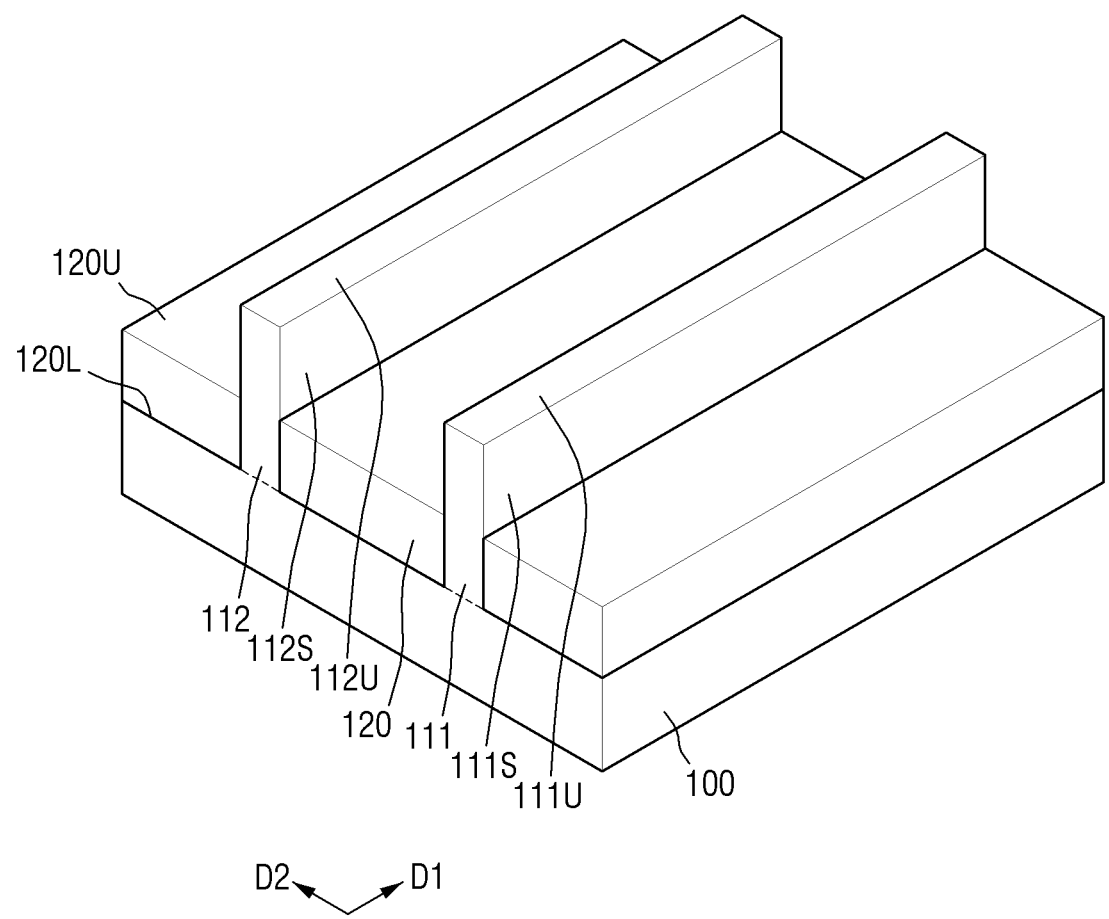

Referring to FIG. 5, a field insulating layer 120 may be formed on the substrate 100.

The field insulating layer 120 may include upper and lower surfaces 120U and 120L opposed to each other. The lower surface 120L of the field insulating layer 120 may be in contact with the upper surface of the substrate 100. The field insulating layer 120 may cover at least a portion of each of the first and second fin type patterns 111 and 112. As show in FIG. 5, for example, the field insulating layer 120 may cover a limited portion of each of the first and second fin type patterns 111 and 112, so that the field insulating layer 120 exposes a separate limited portion of each of the first fin type pattern 111 and the second fin type pattern 112.

When the field insulating layer 120 covers a portion of each of the first fin type pattern 111 and the second fin type pattern 112, the upper surface of each of the first fin type pattern 111 and the second fin type pattern 112 may be higher than the upper surface 120U of the field insulating layer 120. A part of the side walls 111S of the first fin type pattern 111 and a part of the side walls 112S of the second fin type pattern 112 may be surrounded by the field insulating layer 120. That is, the lower portion of each of the first fin type pattern 111 and the second fin type pattern 112 may be surrounded by the field insulating layer 120, while the upper portion of each of the first fin type pattern 111 and the second fin type pattern 112 may protrude from the field insulating layer 120.

The field insulating layer 120 may include at least one of a silicon oxide film, a silicon nitride film and a silicon oxynitride film.

In some example embodiments of the present disclosure, the first and second fin type patterns 111 and 112 may be doped with impurities to adjust the threshold voltages. If the transistor formed by using the first fin type pattern 111 and the second fin type pattern 112 is of an NMOS transistor, the impurities may be, for example, boron (B). If the transistor formed by using the first fin type pattern 111 and the second fin type pattern 112 is of a PMOS transistor, the impurities may be, for example, phosphorous (P) or arsenic (As).

Figure 6:
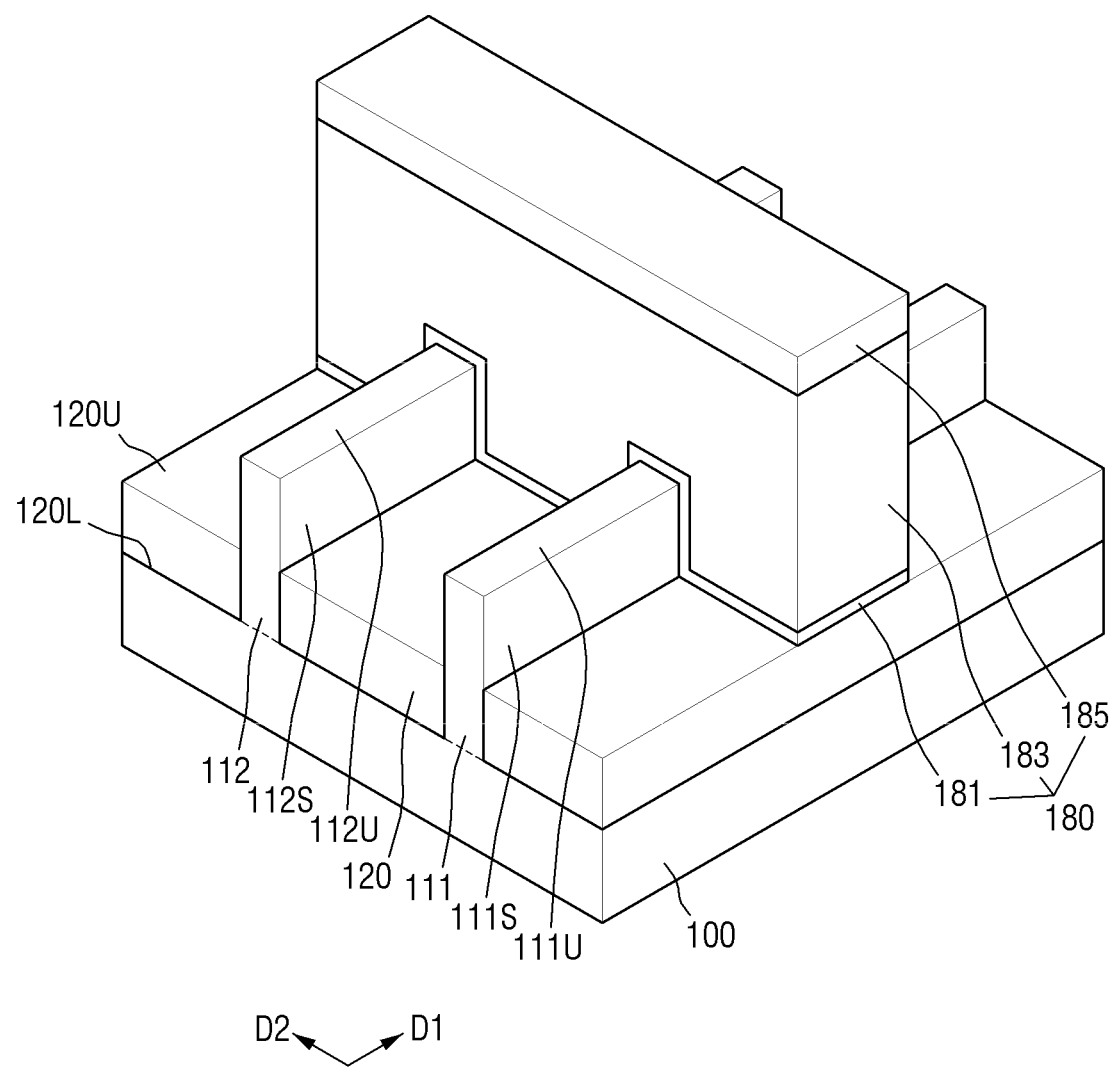

Referring to FIG. 6, a second gate structure 180 may be formed on the field insulating layer 120, the first fin type pattern 111, and the second fin type pattern 112. The second gate structure 180 may be disposed such that it intersects with each of the first fin type pattern 111 and the second fin type pattern 112. For example, each of the first fin type pattern 111 and the second fin type pattern 112 may be extended in the second direction D2.

The second gate structure 180 may include a second gate insulating layer 181, a second gate electrode 183, and a first hard mask 185 stacked on one another in this order. The second gate structure 180 may be a stack of the second gate insulating layer 181, the second gate electrode 183 and the first hard mask 185 extending in the second direction D2.

The second gate structure 180 may be formed using the first hard mask 185 as an etching mask. In some example embodiments, the second gate structure 180 may be formed based on forming a gate structure layer on the field insulating layer 120 and the first and second fin type patterns 111 and 112 and further patterning the gate structure layer to form the second gate structure 180.

The second gate insulating layer 181 is shown as being formed not only on the periphery of each of the first fin type pattern 111 and the second fin type pattern 112 but also on the upper surface 120U of the field insulating layer 120. It is, however, to be understood that this is merely illustrative. For example, the second gate insulating layer 181 may be formed only on side walls 111S and an upper surface 111U of the first fin type pattern 111, and side walls 112S and an upper surface of the second fin type pattern 112, which protrude above the field insulating layer 120.

The second gate insulating layer 181 is shown as not being formed at the periphery of each of the first and second fin type patterns 111 and 112 which does not overlap with the second gate structure 180. It is, however, to be understood that this is merely illustrative. For example, the second gate insulating layer 181 may also be formed at the entire periphery of each of the first and second fin type patterns 111 and 112 protruding above the field insulating layer 120.

The second gate insulating layer 181 may include, for example, silicon oxide.

In some example embodiments of the present disclosure, the second gate structure 180 may further include an interface insulating layer. The interface insulating layer may be formed between the second gate insulating layer 181 and the field insulating layer 120, between the second gate insulating layer 181 and the first fin type pattern 111, and between the second gate insulating layer 181 and the second fin type pattern 112. The interface insulating layer may include a low-k material layer having a dielectric constant (k) of 9 or less, for example, a silicon oxide film with the value of k being approximately 4 or a silicon oxynitride film with the value of k being approximately 4 to 8 depending on the contents of oxygen atoms and nitrogen atoms.

The second gate electrode 183 may be disposed on the second gate insulating layer 181. The second gate electrode 183 may entirely cover each of the first and second fin type patterns 111 and 112 that overlap with the second gate structure 180 and protrude above the field insulating layer 120. That is, the height from the upper surface 120U of the field insulating layer 120 to the upper surface 111U of the first fin type pattern 111 and the height from the upper surface 120U of the field insulating layer 120 to the upper surface of the second fin type pattern 112 may be smaller than the height from the upper surface 120U of the field insulating layer 120 to the upper surface of the second gate electrode 183.

In some example embodiments of the present disclosure, the second gate electrode 183 may include polysilicon. Each of the second gate electrode 183 and the second gate insulating layer 181 may have a high etch selectivity. The second gate electrode 183 may be etched to form a replacement gate metal gate (e.g., the first gate structure 130 of FIG. 1). In doing so, the second gate electrode 183 is removed, but the second gate insulating layer 181 may remain.

The first hard mask 185 may be formed on the second gate electrode 183. The first hard mask 185 may include, but is not limited to, silicon nitride (SiN).

Figure 7:
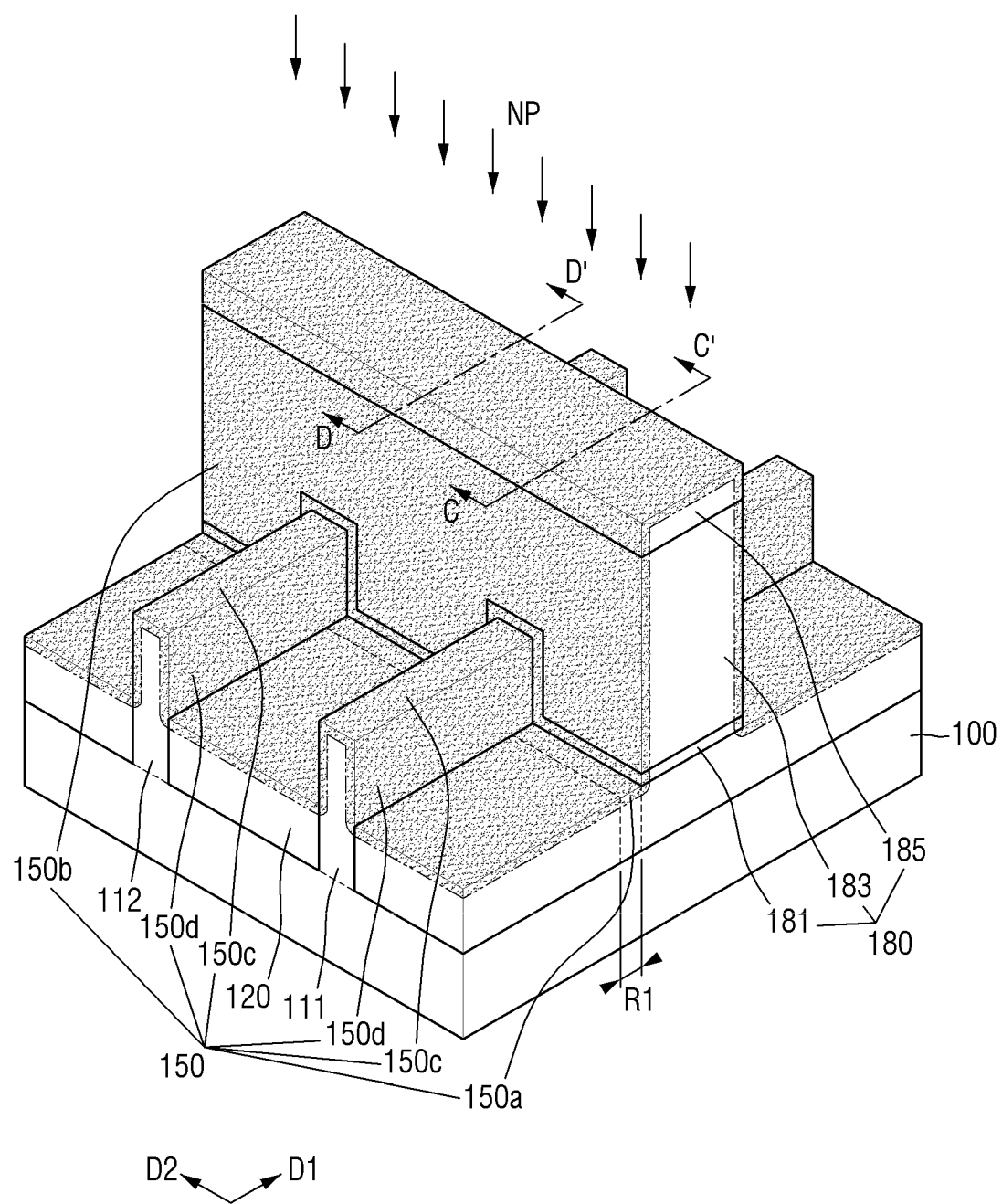
Figure 8:
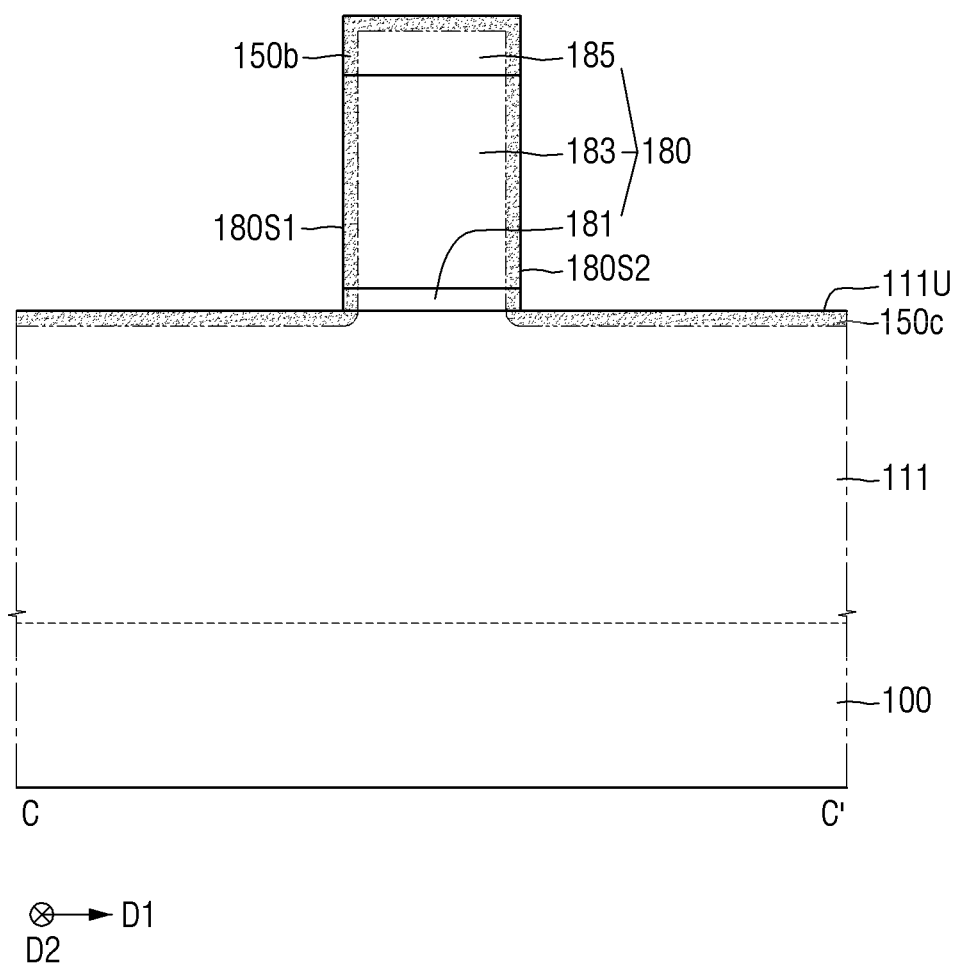
Figure 9:
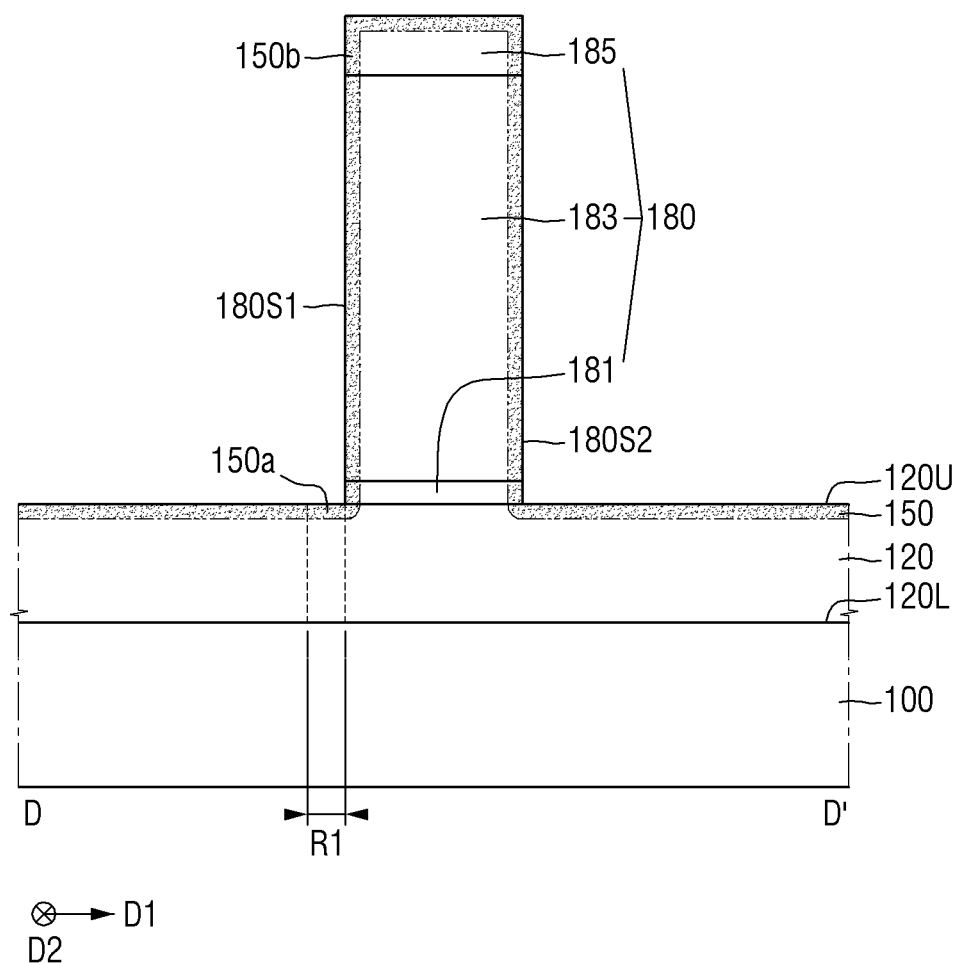

Referring to FIGS. 7, 8, and 9, a barrier layer 150 may be formed. FIG. 8 is a cross-sectional view taken along line C-C' of FIG. 7. FIG. 9 is a cross-sectional view taken along line D-D' of FIG. 7.

The barrier layer 150 may be formed on the field insulating layer 120 exposed by the second gate structure 180. In addition, the barrier layer 150 may be formed on the upper surface 111U and the side walls 111S of the first fin type pattern 111, the upper surface 112U and the side walls 112S of the second fin type pattern 112, which protrude from the field insulating layer 120 and are exposed by the second gate structure 180. In addition, the barrier layer 150 may be formed on both sidewalls 180S1 and 180S2 and upper surface of the second gate structure 180.

The barrier layer 150 may include a first barrier layer 150a, a second barrier layer 150b, a third barrier layer 150c and a fourth barrier layer 150d.

The first barrier layer 150a may be formed in the first region R1 of the field insulating layer 120. The first region R1 of the field insulating layer 120 may be a portion of the field insulating layer 120 that is exposed by the second gate structure 180, is adjacent to the second gate structure 180 and extended ("extends") in the second direction D2. In the first region R1 of the field insulating layer 120, a gate spacer 140 (see FIG. 10) may be formed in a subsequent process (e.g., subsequently to the first barrier layer 150a being formed). That is, in the first region R1 of the field insulating layer 120, the gate spacer may overlap ("vertically overlap") with the field insulating layer 120. The first region R1 may include a nitrogen element.

As shown in at least FIG. 7, the first barrier layer 150a may be formed in the upper portion of the field insulating layer 120, including an upper surface of the field insulating layer 120, for example. However, the technical idea of the present disclosure is not limited thereto. For example, at least a part of the first barrier layer 150a may protrude from the upper surface 120U of the field insulating layer 120.

The first barrier layer 150a may include a nitrogen element (e.g., a nitrogen-containing compound). The first barrier layer 150a may include, for example, silicon oxynitride. Due to the first barrier layer 150a, in the first region R1 of the field insulating layer 120, the upper portion of the field insulating layer 120 may include the nitrogen element.

The second gate structure 180 may include a first sidewall 180S1 and a second sidewall 180S2 opposed to each other. The second barrier layer 150b may be formed on the upper surface of the second gate structure 180, the first sidewall 180S1 of the second gate structure 180 and the second sidewall 180S2 of the second gate structure 180.

The second barrier layer 150b may be formed in the second gate insulating layer 181, in the second gate electrode 183, and in the first hard mask 185, for example. In this case, the portions of the second gate insulating layer 181 adjacent to the first sidewall 180S1 and the second sidewall 180S2 of the second gate structure 180 may include a part of the second barrier layer 150b. In addition, the portions of the second gate electrode 183 adjacent to the first sidewall 180S1 and the second sidewall 180S2 of the second gate structure 180 may include a part of the second barrier layer 150b. In addition, the portions of the first hard mask 185 adjacent to the first sidewall 180S1 and the second sidewall 180S2 of the second gate structure 180 and a portion of the upper surface of the first hard mask may include the rest of the second barrier layer 150b.

However, the technical idea of the present disclosure is not limited thereto. For example, at least a part of the second barrier layer 150b may cover the second gate structure 180 and may protrude above the upper surface of the second gate structure 180, the first sidewall 180S1 and the second sidewall 180S2.

The second barrier layer 150b may include a nitrogen element. The second barrier layer 150b may include, for example, silicon oxynitride. The second barrier layer 150b may include, in another example, silicon nitride. Due to the second barrier layer 150b, the first sidewall 180S1 and the second sidewall 180S2 of the second gate structure 180 may include the nitrogen element.

The third barrier layer 150c may be formed on the upper surface 111U of the first fin type pattern 111 and the upper surface 112U of the second fin type pattern 112. In some example embodiments, the third barrier layer 150c may be formed on the upper surface 111U of the first fin type pattern 111 and the upper surface 112U of the second fin type pattern 112, which do not overlap with the second gate structure 180. For example, the third barrier layer 150c may be formed in a region where the gate spacer 140 (see FIG. 10) is to be formed on the first fin type pattern 111 and the second fin type pattern 112 in a subsequent process. In other words, the third barrier layer 150c may include a portion formed in a region where the first fin type pattern 111 overlaps with the gate spacer, and a portion formed in a region where the second fin type pattern 112 overlaps with the gate spacer.

The third barrier layer 150c may be formed, for example, in the upper portion of the first fin type pattern 111 and the upper portion of the second fin type pattern 112. However, the technical idea of the present disclosure is not limited thereto. For example, it is to be understood that at least a part of the third barrier layer 150c may protrude from the upper surface 111U of the first fin type pattern 111 and the upper surface 112U of the second fin type pattern 112.

The third barrier layer 150c may include a nitrogen element. The third barrier layer 150c may include, for example, either silicon oxynitride or silicon nitride. Due to the third barrier layer 150c, the upper portion of the first fin type pattern 111 in the region where the first fin type pattern 111 overlaps with the gate spacer and the upper portion of the second fin type pattern 112 in the region where the second fin type pattern 112 overlaps with the gate spacer may include the nitride element.

The fourth barrier layer 150d may be formed on the side wall 111S of the first fin type pattern 111 and the side wall 112S of the second fin type pattern 112. In some example embodiments, the fourth barrier layer 150d may be formed on the side wall 111S of the first fin type pattern 111 and the side wall of the second fin type pattern 112, which do not overlap with the second gate structure 180.

The fourth barrier layer 150d may be formed, for example, on the side wall 111S of the first fin type pattern 111 and the side wall 112S of the second fin type pattern 112. The fourth barrier layer 150d may connect the third barrier layer 150c with the first barrier layer 150a.

The fourth barrier layer 150d may be formed, for example, in the side wall 111S of the first fin type pattern 111 and also in the side wall 112S of the second fin type pattern 112. However, the technical idea of the present disclosure is not limited thereto. For example, it is to be understood that at least a part of the fourth barrier layer 150d may protrude from the side wall 111S of the first fin type pattern 111 and the side wall 112S of the second fin type pattern 112.

The fourth barrier layer 150d may include a nitrogen element. The fourth barrier layer 150d may include, for example, either silicon oxynitride or silicon nitride.

In some example embodiments, the barrier layer 150 may be formed through a nitriding process (NP). For example, as shown in FIGS. 7-9, the barrier layer 150 may be formed based on performing a nitriding process on an upper surface of the field insulating layer 120, upper surfaces 111U and 112U of the first and second fin type patterns 111 and 112, side walls 111S and 112S of the first and second fin type patterns 111 and 112, an upper surface of the second gate structure 180 and a side wall of the second gate structure 180. In some example embodiments, in some example embodiments, the barrier layer 150 may be formed by depositing a nitride film containing nitrogen element through a deposition process. In some example embodiments, the first barrier layer 150a, the second barrier layer 150b, the third barrier layer 150c, and the fourth barrier layer 150d may be formed simultaneously.

Figure 10:
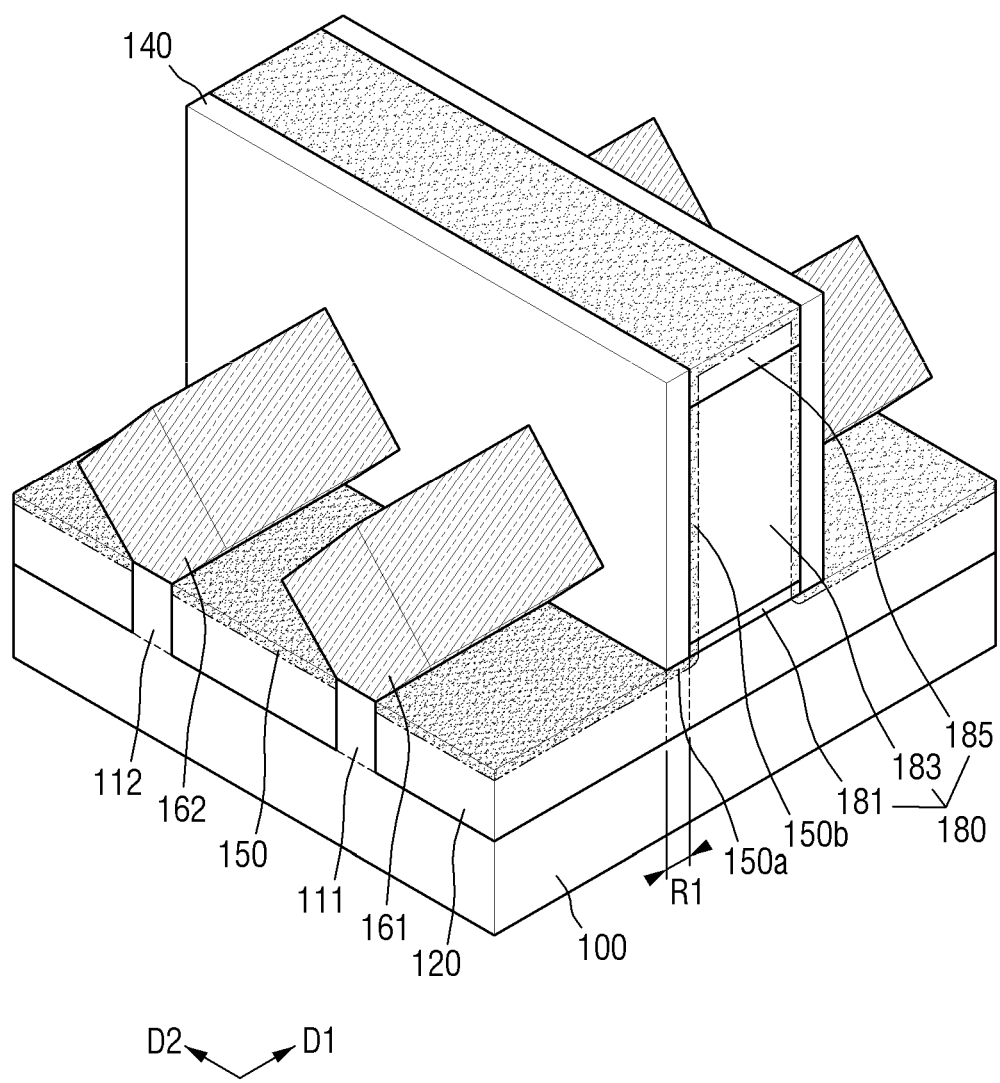

Referring to FIG. 10, the gate spacers 140 may be formed on both sidewalls of the second gate structure 180, respectively.

The gate spacer 140 may be formed on the sidewall of the second gate structure 180. The gate spacer 140 may be formed on the first region R1 of the field insulating layer 120, and the gate spacer 140 may overlap with the first region R1 of the field insulating layer 120. The gate spacer 140 may be formed on the first barrier layer 150a and the second barrier layer 150b. As shown in FIG. 10, the second barrier layer 150b may be between the gate spacer 140 and a side wall of the second gate structure 180.

Each of the first semiconductor pattern feature 161 and the second semiconductor pattern feature 162 may be formed on the first fin type pattern 111 and the second fin type pattern 112, respectively. Each of the first semiconductor pattern feature 161 and the second semiconductor pattern feature 162 may be formed on at least one side of the second gate structure 180. Each of the first semiconductor pattern feature 161 and the second semiconductor pattern feature 162 may be a source/drain of the transistor, e.g., an elevated source/drain.

Each of the first semiconductor pattern feature 161 and the second semiconductor pattern feature 162 may have various shapes such as a diamond shape, a circular shape, and a rectangular shape. Although the semiconductor pattern features shown in FIG. 10 have a pentagon shape, this is merely illustrative.

In some example embodiments, each of the first semiconductor pattern feature 161 and the second semiconductor pattern feature 162 may be formed by removing the portion of the first fin type pattern 111 and the portion of the second fin type pattern 112 protruding from the barrier layer 150 and then using an epitaxial growth.

Figure 11:
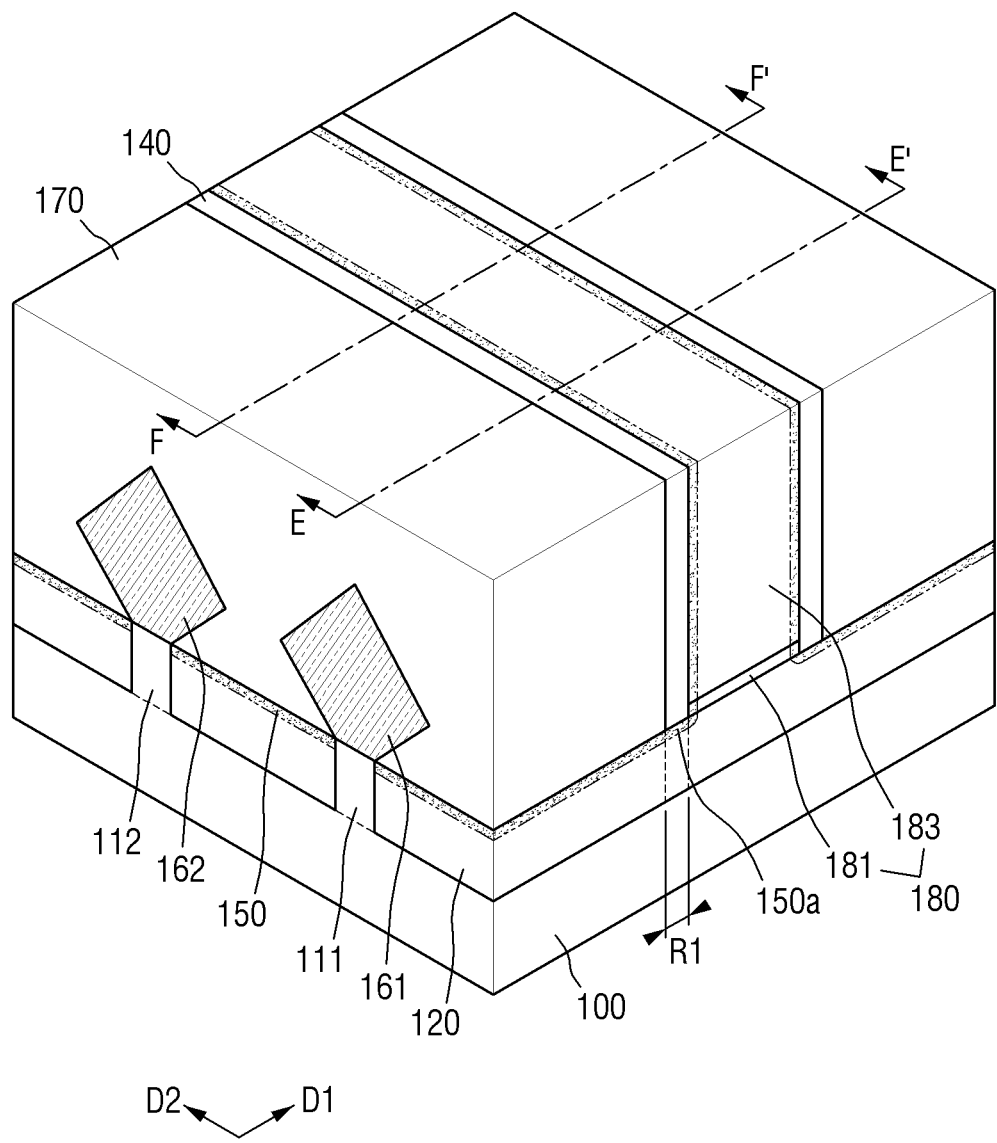

Referring to FIG. 11, an interlayer insulating layer 170 covering the first semiconductor pattern feature 161, the second semiconductor pattern feature 162 and the second gate structure 180 may be formed on the barrier layer 150.

In some example embodiments, the interlayer insulating layer 170 may be flattened until the upper surface of the second barrier layer 150b is exposed.

In some example embodiments, in some example embodiments, the interlayer insulating layer 170 may be flattened until the upper surface of the second gate electrode 183 is exposed. In this case, the portion of the second barrier layer 150b on the first hard mask 185 and the first hard mask 185 may be removed together.

Figure 12:
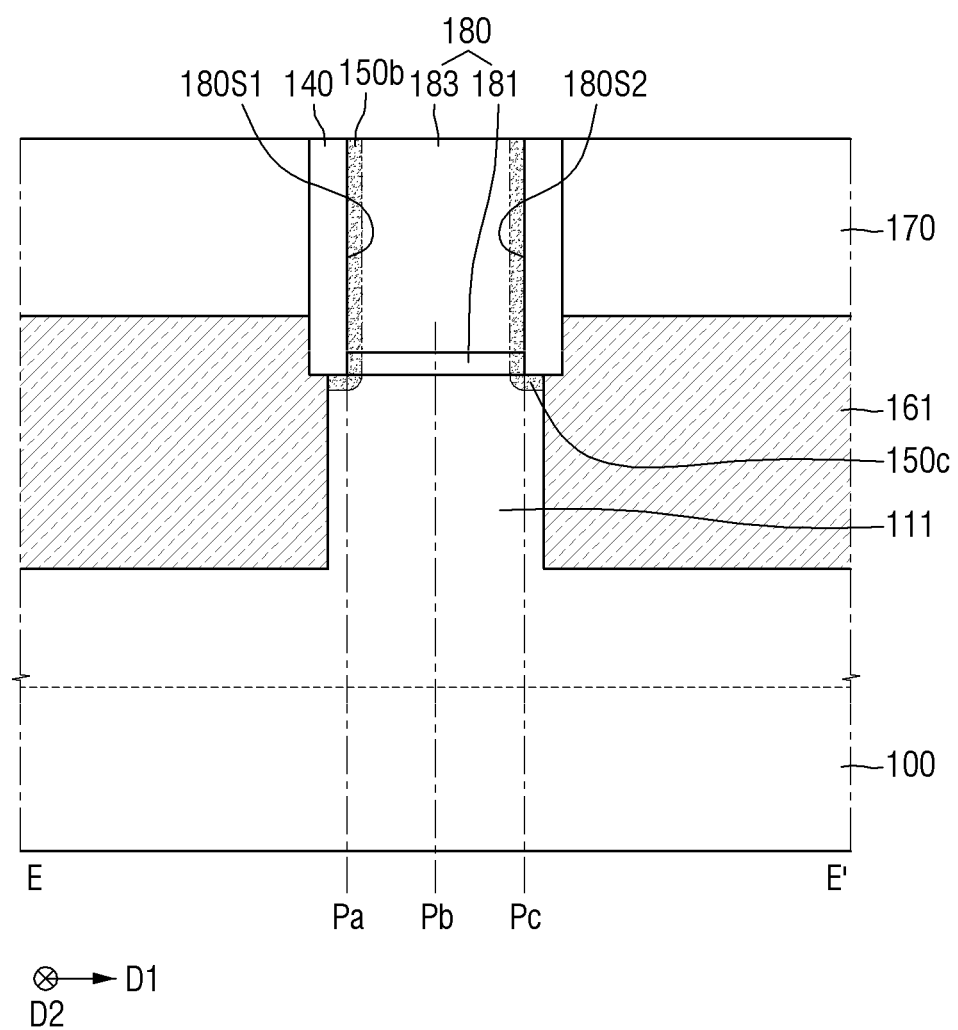

FIG. 12 is a cross-sectional view taken along line E-E' of FIG. 11. FIG. 13 is an example graph illustrating the concentration of nitrogen element in the second gate structure 180 of FIG. 12. In the graph shown in FIG. 13, the x-axis may represent the distance between the first sidewall 180S1 and the second sidewall 180S2 of the second gate structure 180 in AU, and the y-axis may represent concentration of nitrogen element in the second gate structure 180 in AU.

Figure 13:
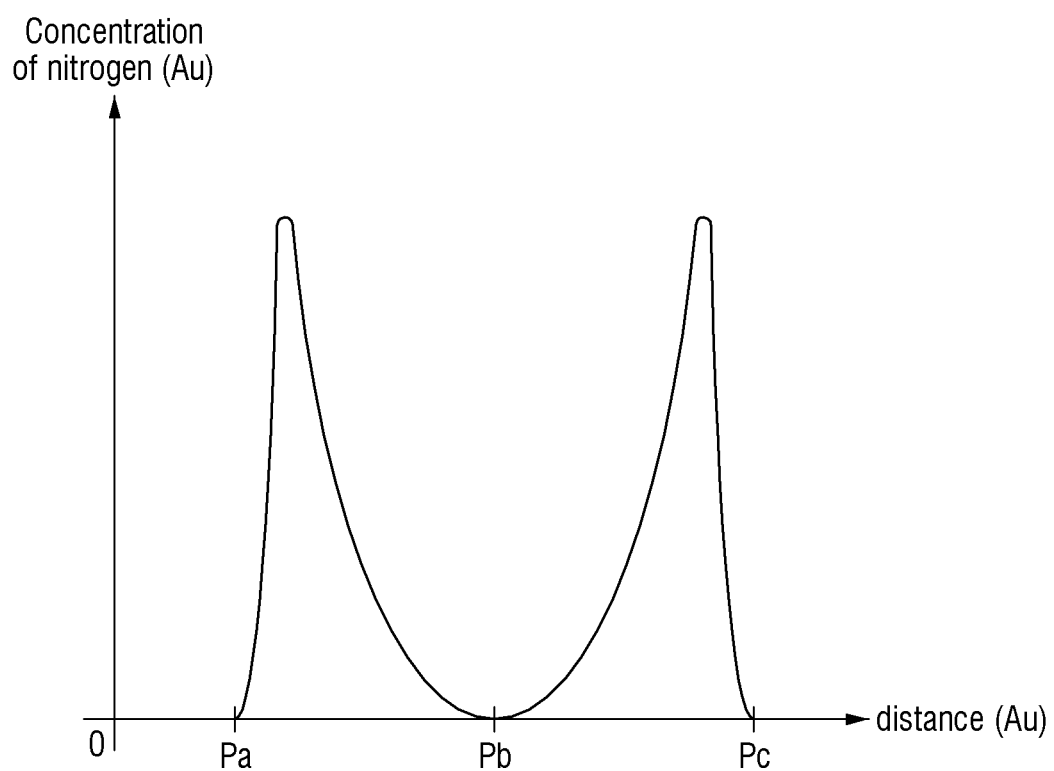

Referring to FIGS. 12 and 13, a second barrier layer 150b may be disposed between the gate spacer 140 and the second gate electrode 183 and between the gate spacer 140 and the second gate insulating layer 181. As described above, the second barrier layer 150b may be formed on each of the first sidewall 180S1 and the second sidewall 180S2 of the second gate structure 180.

In addition, after the formation of the first semiconductor pattern feature 161 and the second semiconductor pattern feature 162, the third barrier layer 150c may remain in portions of the first and second fin type patterns 111 and 112, which overlap with the gate spacer 140. For example, the first fin type pattern 111 and the second fin type pattern 112 may each include a region overlapping with the gate spacer 140, and an upper portion of each of the first and second fin type patterns 111 and 112 includes a nitrogen element in the region overlapping with the gate spacer 140.

The concentration of the nitrogen element in the second gate structure 180 may be decreased and increased from the first sidewall 180S1 to the second sidewall 180S2 of the second gate structure 180.

That is, the concentration of the nitrogen element in the second gate structure 180 may decrease from a first point Pa to a second point Pb. In addition, the concentration of the nitrogen element in the second gate structure 180 may increase from the second point Pb to a third point Pc. The first point Pa may be, for example, where the first sidewall 180S1 of the second gate structure 180 is located. The second point Pb may be, for example, a central point between the first sidewall 180S1 and the second sidewall 180S2 of the second gate structure 180. The third point Pc may be, for example, where the second sidewall 180S2 of the second gate structure 180 is located.

Due to the second barrier layer 150b, the concentration of the nitrogen element in the portion of the second gate structure 180 adjacent to the first point Pa may be greater than the concentration of the nitrogen element in the portion of the second gate structure 180 adjacent to the second point Pb. Due to the second barrier layer 150b, the concentration of the nitrogen element in the portion of the second gate structure 180 adjacent to the third point Pc may be greater than the concentration of the nitrogen element in the portion of the second gate structure 180 adjacent to the second point Pb.

Figure 14:
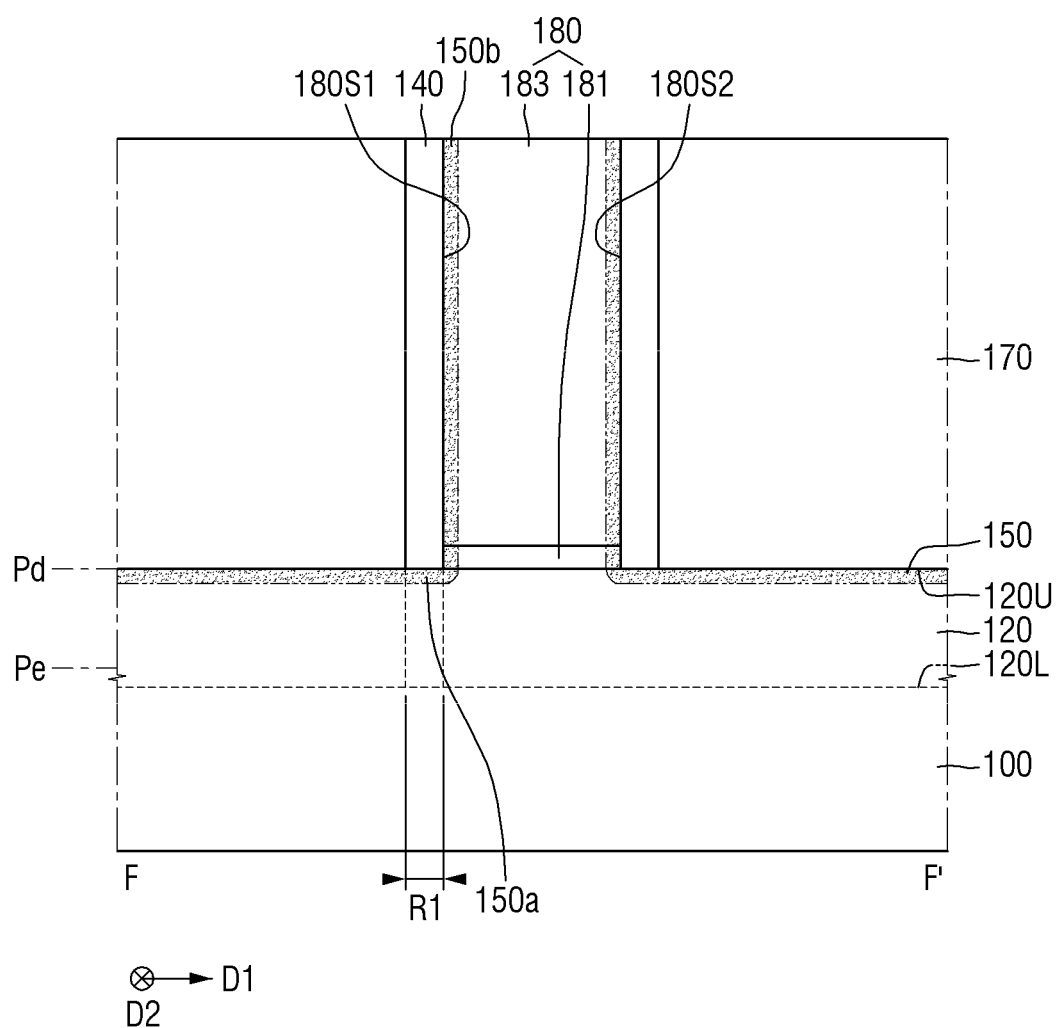

FIG. 14 is a cross-sectional view taken along line F-F' of FIG. 11. FIG. 15 is an example graph illustrating the concentration of nitrogen element in the first region R1 of the field insulating layer 120 of FIG. 14. In the graph shown in FIG. 15, the x-axis may represent the depth of the field insulating layer 120 from the upper surface of the first barrier layer 150a in AU, and the y-axis may represent concentration of nitrogen element in the first region R1 of the field insulating layer 120 in AU.

In the first region R1 of the field insulating layer 120, the concentration of the nitrogen element at the upper portion of the field insulating layer 120 may be greater than the concentration of the nitrogen element at the lower portion of the field insulating layer 120. The lower portion of the field insulating layer 120 may be, for example, a portion that includes the lower surface 120L of the field insulating layer 120. The concentration of the nitrogen element in the first region R1 of the field insulating layer 120 may decrease from the upper surface 120U to the lower surface 120L of the field insulating layer 120. Restated, the concentration of the nitrogen element in the first region R1 may be inversely proportional with the magnitude of distance from the upper surface 120U and proportional with the magnitude of distance from the lower surface 120L.

That is, the concentration of the nitrogen element in the first region R1 of the field insulating layer 120 may decrease from a fourth point Pd to a fifth point Pe.

The fourth point Pd may be, for example, the point where the upper surface of the first barrier layer 150a is located. In some example embodiments, when the first barrier layer 150a is formed in the field insulating layer 120, the fourth point Pd may be the point where the upper surface 120U of the field insulating layer 120 is located. The fifth point Pe may be a point adjacent to the lower surface 120L of the field insulating layer.

Figure 15:
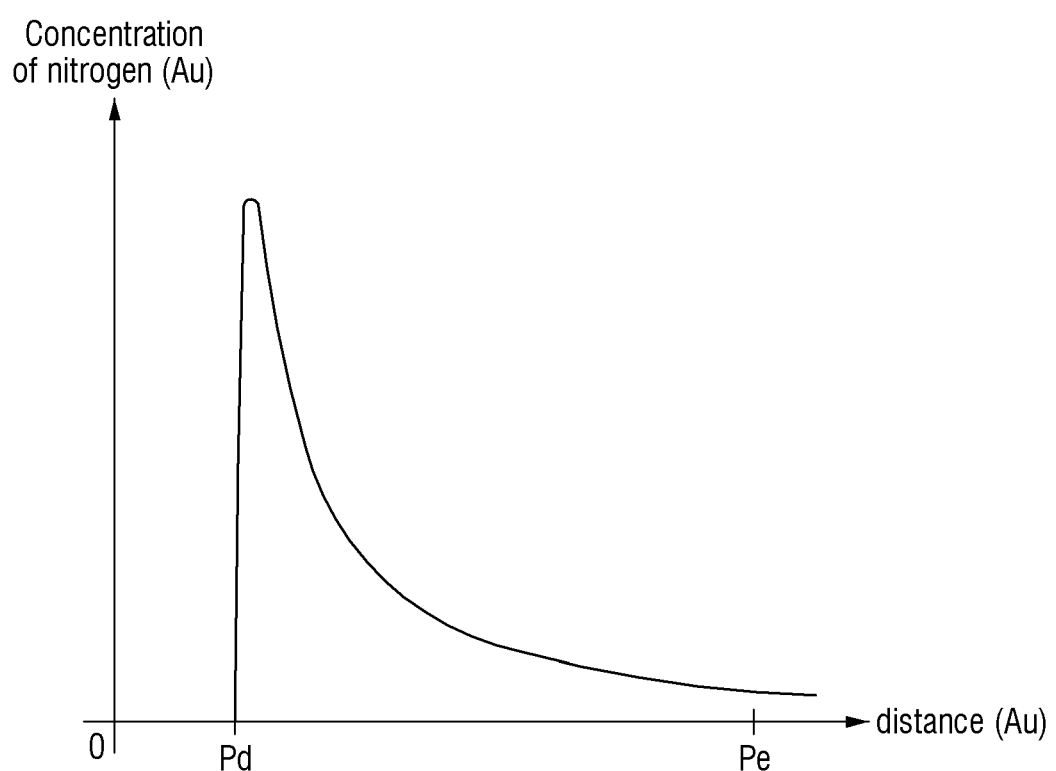

Although nitrogen element at a certain concentration exists at the fifth point Pe in the graph of FIG. 15, this is merely illustrative. For example, at the fifth point Pe adjacent to the lower surface 120L of the field insulating layer 120, the concentration of the nitrogen element may be substantially 0 AU.

Figure 16:
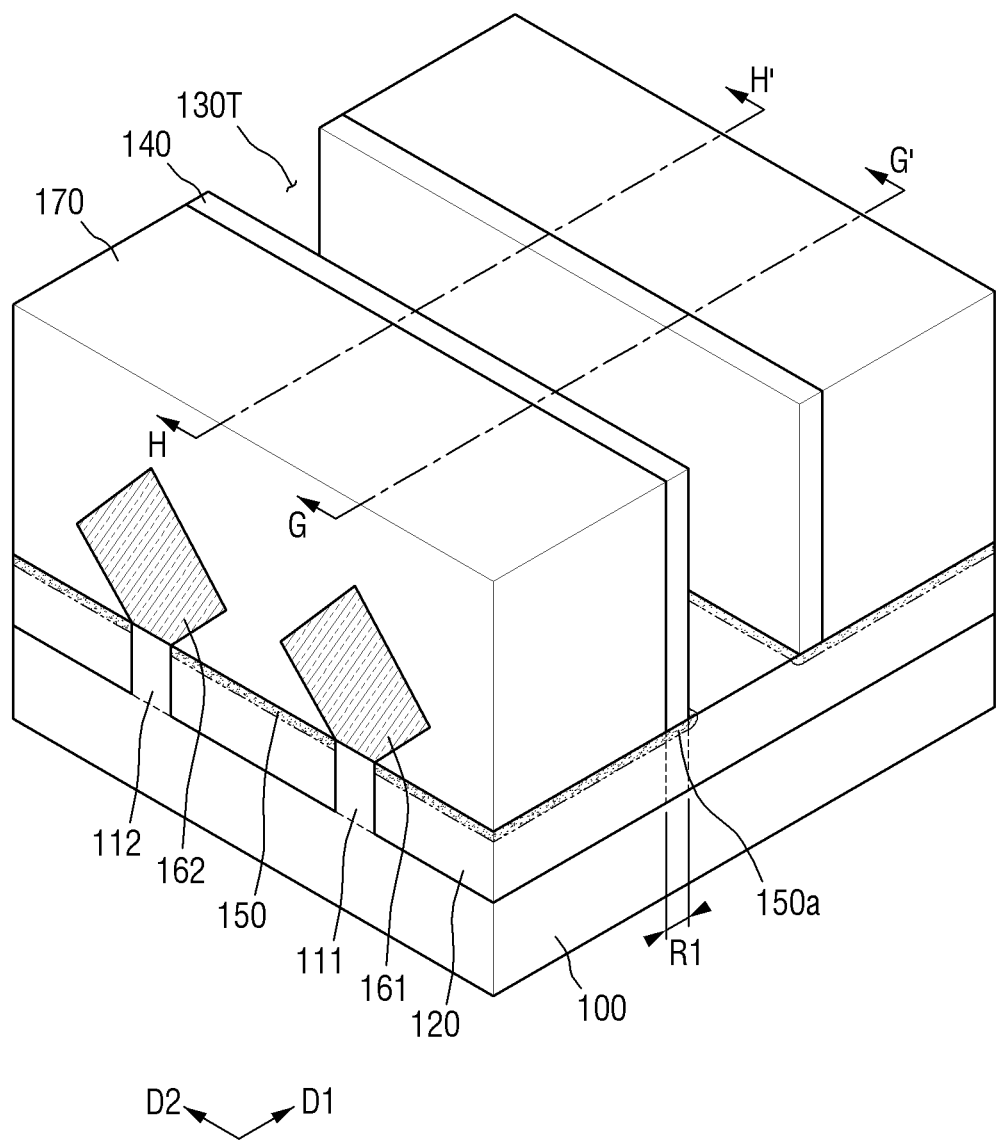
Figure 17:
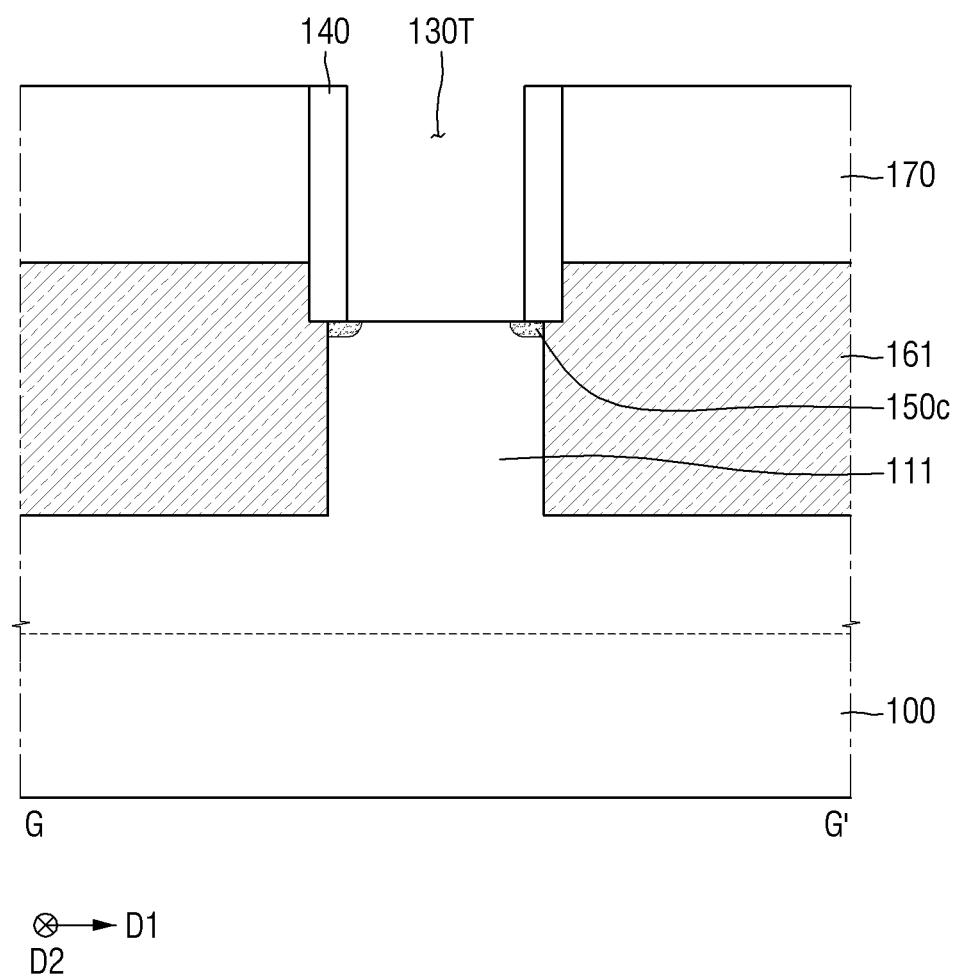
Figure 18:
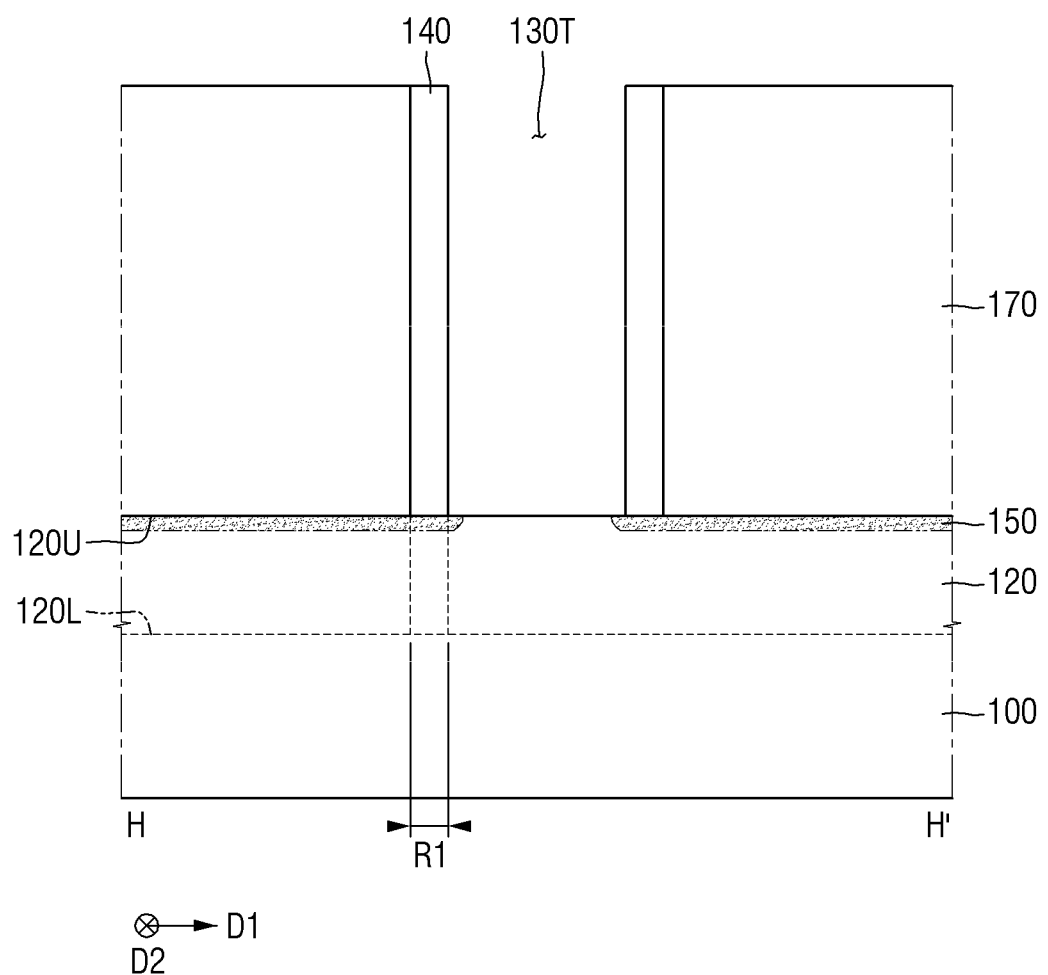

FIG. 17 is a cross-sectional view taken along line G-G' of FIG. 16. FIG. 18 is a cross-sectional view taken along line H-H' of FIG. 16.

Referring to FIG. 16, FIG. 17, and FIG. 18, the second gate insulating layer 181 and the second gate electrode 183 may be removed, so that a gate trench 130T may be formed. The sidewalls of the gate trenches 130T may be defined by the gate spacers 140. The gate trench 130T may expose the upper surface of the first fin type pattern 111, the upper surface of the second fin type pattern 112 and the upper surface 120U of the field insulating layer 120.

In some example embodiments, the second gate insulating layer 181 and the second gate electrode 183 may be removed (and thus the second gate structure 180 may be removed) to form a replacement gate electrode (e.g., the first gate structure 130 of FIG. 1). The second gate insulating layer 181 and the second gate electrode 183 may be removed, for example, by a wet etching process. In some example embodiments, the second gate structure 180 that is removed may be referred to as a "dummy gate structure."

By performing a process of etching the second gate insulating layer 181 and the second gate electrode 183, the second gate insulating layer 181 and the second gate electrode 183 can be removed, leaving the gate spacer 140. In the process of etching the second gate insulating layer 181 and the second gate electrode 183, an etchant may be used to remove the second gate insulating layer 181 and the second gate electrode 183.

The etchant may not permeate into the gate spacer 140 due to the second barrier layer 150b. By virtue of the second the second barrier layer 150b, it is possible to prevent the thickness of the gate spacer 140 from being thinned due to etchant in the process of etching the second gate insulating layer 181 and the second gate electrode 183. Therefore, it is possible to prevent that the width of the first gate structure 130 to be formed in the gate trench 130T is increased in the first direction D1 in a subsequent process. This may result in improvements in the performance and in the yield of the semiconductor devices.

By virtue of the first barrier layer 150a and the third barrier layer 150c, it is possible to prevent the etchant from permeating into the first semiconductor pattern feature 161 and the second semiconductor pattern feature 162 through the field insulating layer 120, the first fin type pattern 111 and the second fin type pattern 112. In other words, it is possible to prevent a short circuit from being created by the etchant by virtue of the first barrier layer 150a and the third barrier layer 150c.

In a subsequent process, a first gate structure 130 (see FIG. 1) may be formed in the gate trench 130T.

Hereinafter, a method for fabricating a semiconductor device according to some example embodiments of the present disclosure will be described with reference to FIGS. 4, 5, 19 and 20. For clarity of illustration, the redundant description will be omitted.

Figure 19:
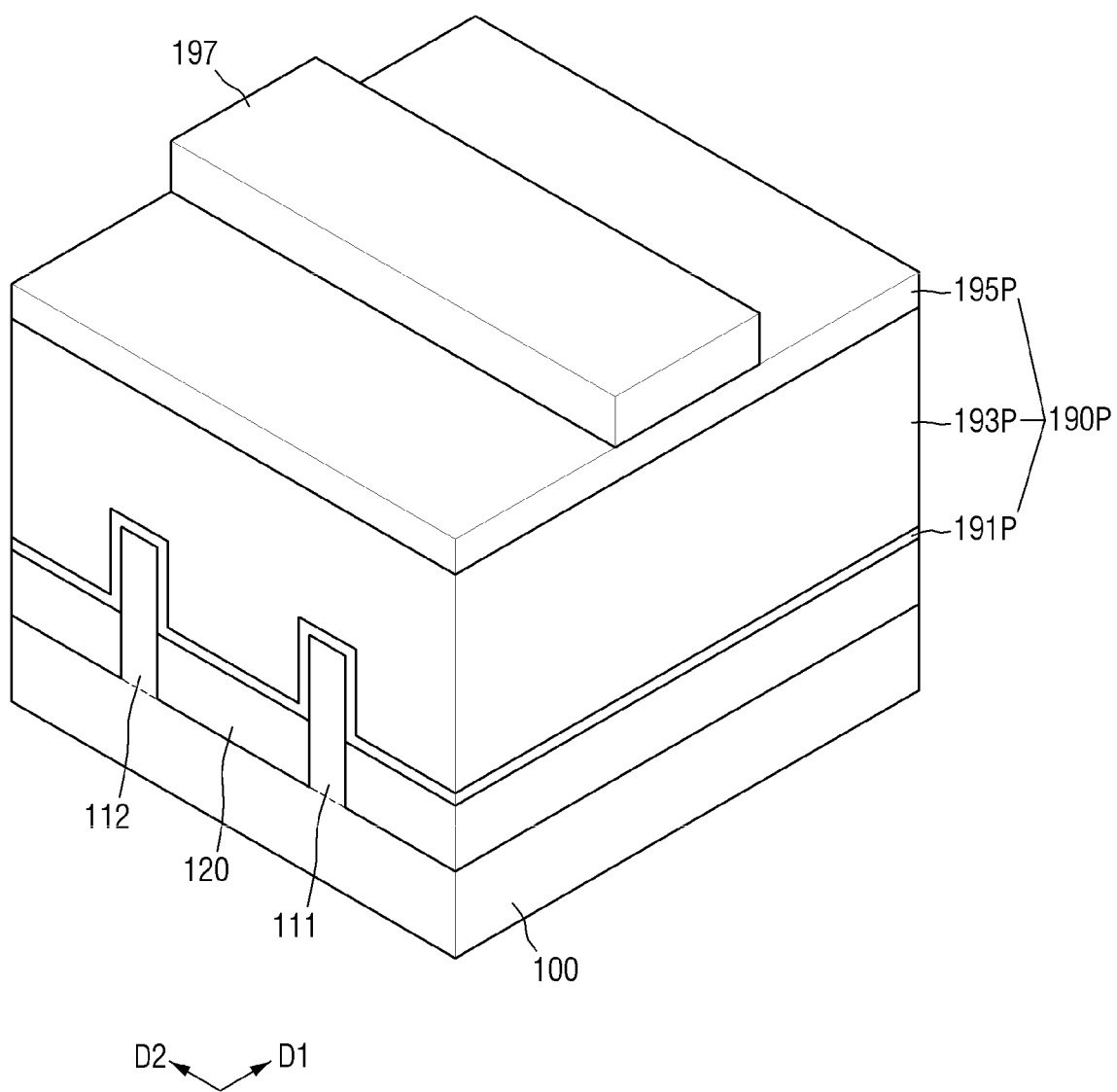
Figure 20:
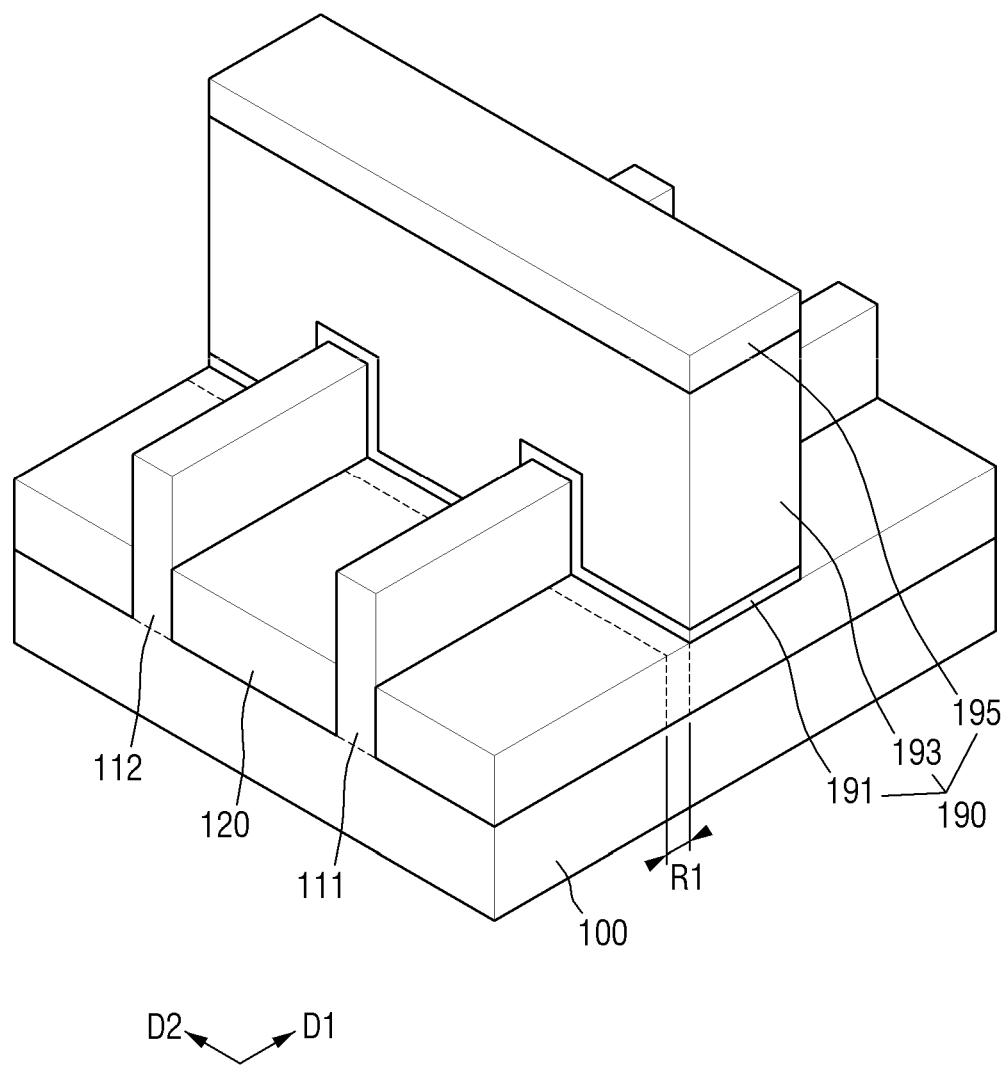

FIGS. 19 to 20 are cross-sectional views illustrating processing steps of a method for fabricating a semiconductor device according to some example embodiments of the present disclosure. FIG. 19 is a view after the process of fabricating the semiconductor device described with respect to FIGS. 4 and 5 has been performed.

Referring to FIG. 19, a third gate structure layer 190P and a mask pattern 197 may be formed on the field insulating layer 120, the first fin type pattern 111 and the second fin type pattern 112.

The third gate structure layer 190P may include a preliminary third gate insulating layer 191P, a preliminary third gate electrode 193P and a preliminary second hard mask 195P sequentially stacked on the field insulating layer 120, the first fin type pattern 111 and the second fin type pattern 112.

In some example embodiments, the third gate structure layer 190P may further include an interface insulating layer. The interface insulating layer may be formed between the preliminary third gate insulating layer 191P and the field insulating layer 120, between the preliminary third gate insulating layer 191P and the first fin type pattern 111, and between the preliminary third gate insulating layer 191P and the second fin type pattern 112. The interface insulating layer may include a low-k material layer having a dielectric constant (k) of 9 or less, for example, a silicon oxide film with the value of k being approximately 4 or a silicon oxynitride film with the value of k being approximately 4 to 8 depending on the contents of oxygen atoms and nitrogen atoms.

The preliminary third gate insulating layer 191P may be formed on the field insulating layer 120 such that it covers the first fin type pattern 111 and the second fin type pattern 112 protruding from the field insulating layer 120. The preliminary third gate insulating layer 191P may include, for example, a high-k dielectric material having a dielectric constant higher than that of silicon. The preliminary third gate insulating layer 191P may include, but is not limited to, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof.

The preliminary third gate electrode 193P may be formed on the preliminary third gate insulating layer 191P. The preliminary third gate electrode 193P may include a metal material. Although the preliminary third gate electrode 193P is shown as a single layer in the drawings, this is merely illustrative. For example, the preliminary third gate electrode 193P may include two or more metal layers. When the preliminary third gate electrode 193P includes two or more metal layers, one of the two or more metal layers can control the work function.

The preliminary second hard mask 195P may be formed on the preliminary third gate electrode 193P. The preliminary second hard mask 195P may include, but is not limited to, silicon nitride.

The mask pattern 197 may be formed on the third gate structure layer 190P.

Referring to FIG. 20, a third gate structure 190 may be formed. The third gate structure 190 may be formed by patterning the third gate structure layer 190P using the mask pattern 197 as an etching mask.

The third gate structure 190 may include a third gate insulating layer 191, a third gate electrode 193, and a second hard mask 195 stacked on one another in this order.

The nitriding process NP of FIG. 7 may be carried out on the third gate structure 190, and the first fin type pattern 111, the second fin type pattern 112 and the field insulating layer 120 exposed by the third gate structure 190, to form the barrier layer 150.

In each of FIGS. 7 to 15, the second gate structure 180 may correspond to the third gate structure 190. In other words, the method for fabricating a semiconductor device described above with reference to FIGS. 7 to 15 may be equally applied to the gate first process in which the gate structure (i.e., the third gate structure 190) is formed first. For example, the first barrier layer 150a may be formed on the first region R1 of the field insulating layer 120, which overlaps with the gate spacer 140 (see FIG. 10) to be formed on either sidewall of the third gate structure 190. In addition, a second barrier layer 150b may be formed on either sidewall of the third gate structure 190. In addition, the third barrier layer 150c may be formed on a portion of the first fin type pattern 111 overlapping with the gate spacer 140 (see FIG. 10).

Hereinafter, a method for fabricating a semiconductor device according to some example embodiments of the present disclosure will be described with reference to FIGS. 21 to 23. For clarity of illustration, the redundant description will be omitted.

Figure 21:
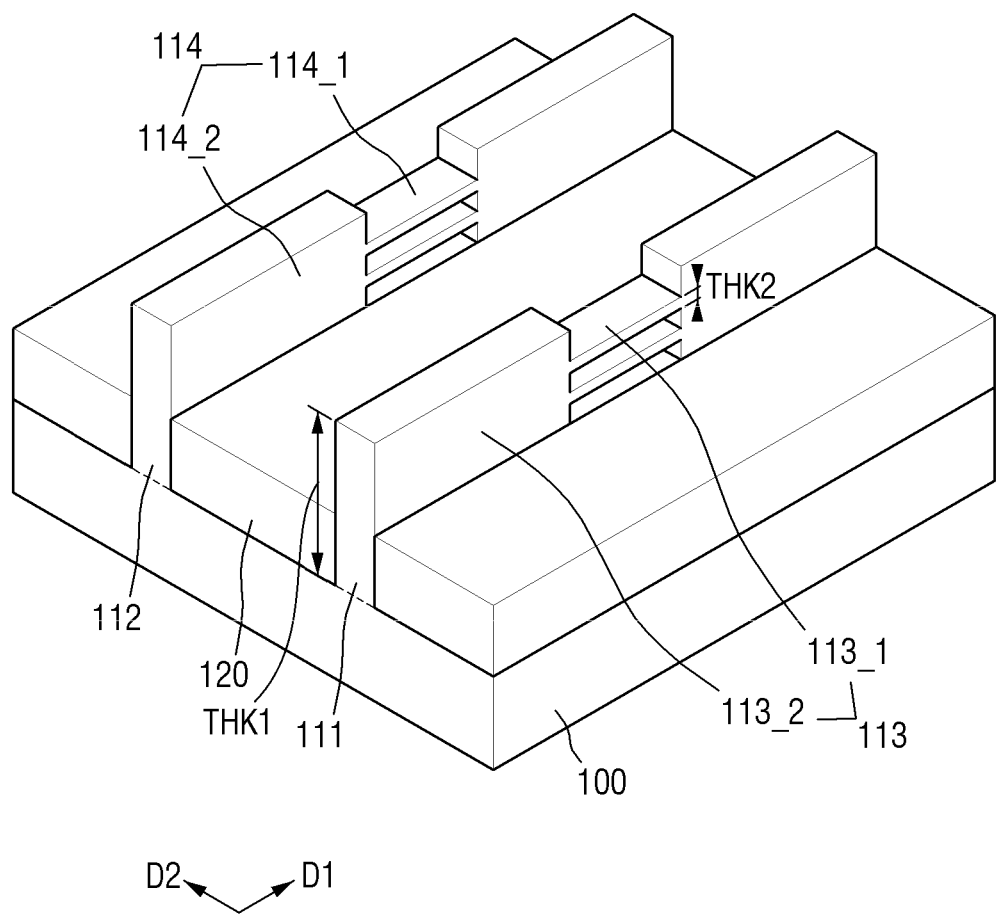
Figure 22:
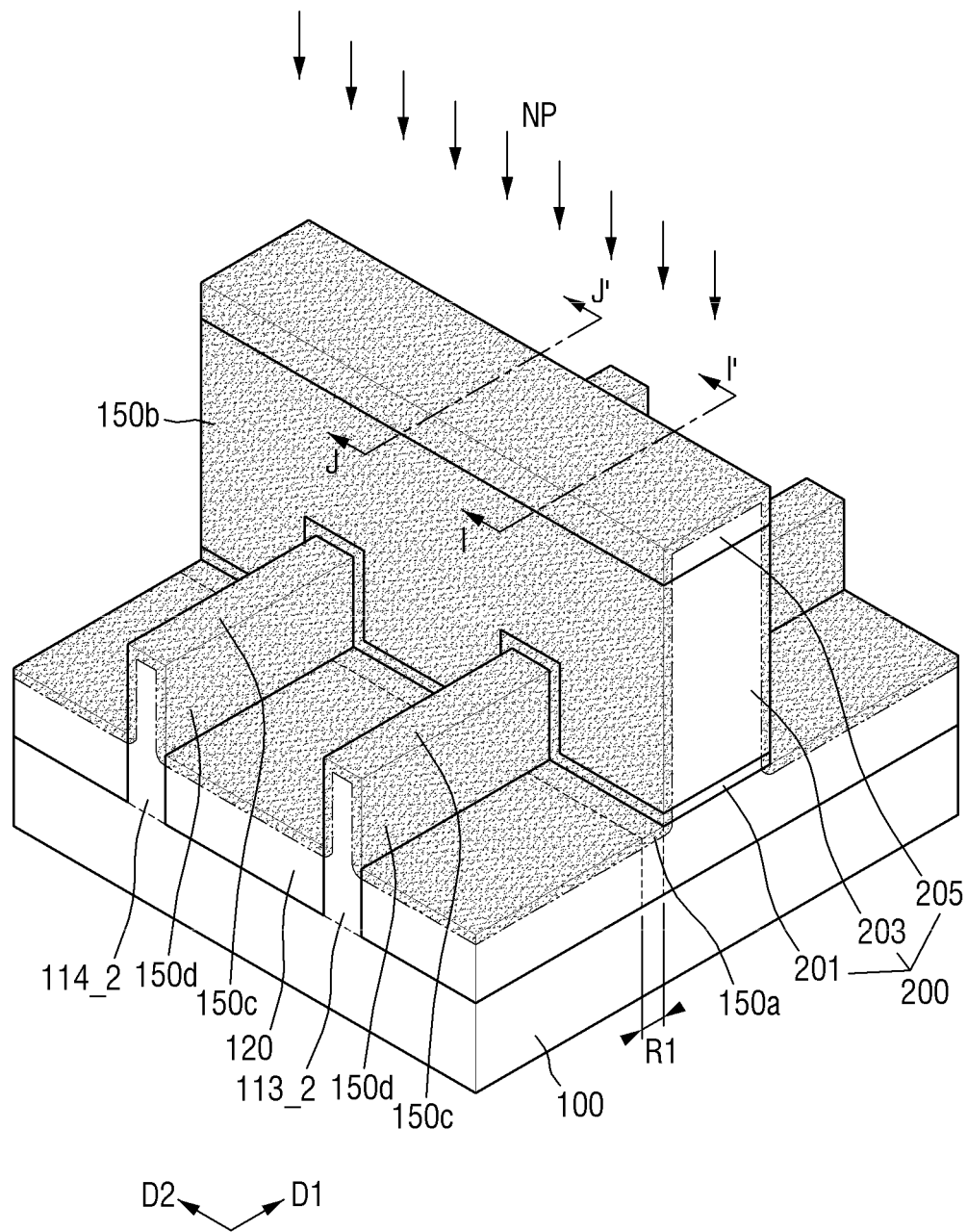

FIGS. 21 to 22 are cross-sectional views illustrating processing steps of a method for fabricating a semiconductor device according to some example embodiments of the present disclosure. FIG. 23 is a cross-sectional view taken along line I-I' of FIG. 22. The cross-sectional view of FIG. 22 taken along line J-J' may correspond to that of FIG. 9.

Referring to FIG. 21, the third fin type pattern 113 and the fourth fin type pattern 114 may protrude from the substrate 100 and extend in the first direction D1. The third fin type pattern 113 and the fourth fin type pattern 114 may be spaced apart from each other in the second direction D2.

The third fin type pattern 113 may include a first portion 113_1 and second portions 113_2, and the fourth fin type pattern 114 may include a first portion 114_1 and second portions 114_2.

The first portion 113_1 of the third fin type pattern 113 may be formed between the second portions 113_2 of the third fin type pattern 113. The first portion 113_1 of the third fin type pattern 113 may be connected to the second portions 113_2 of the third fin type pattern 113. The first portion 113_1 of the third fin type pattern 113 may overlap with the fourth gate structure 200 (see FIG. 22). The first portion 113_1 of the third fin type pattern 113 may correspond to the channel region of a transistor.

The second portions 113_2 of the third fin type pattern 113 may have a first thickness THK1 with respect to the upper surface of the substrate 100. The first portions 113_1 of the third fin type pattern 113 may have a second thickness THK2 with respect to the upper surface of the substrate 100. The first thickness THK1 may be greater than the second thickness THK2.

The first portion 114_1 of the fourth fin type pattern 114 may correspond to the first portion 113_1 of the third fin type pattern 113, and the second portions 114_2 of the fourth fin type pattern 114 may correspond to the second portions 113_2 of the third fin type pattern 113.

Referring to FIGS. 22 and 23, a fourth gate structure 200 may be formed on the field insulating layer 120, the third fin type pattern 113, and the fourth fin type pattern 114. The fourth gate structure 200 may be formed such that it overlaps with the first portion 113_1 of the third fin type pattern 113 and the first portion 114_1 of the fourth fin type pattern 114, for example.

The fourth gate structure 200 may include a fourth gate insulating layer 201, a fourth gate electrode 203, and a third hard mask 205.

The fourth gate insulating layer 201 may be formed on the upper surface of the field insulating layer 120. The fourth gate insulating layer 201 may be formed such that it covers the first portion 113_1 of the third fin type pattern 113 and the first portion 114_1 of the fourth fin type pattern 114. The fourth gate insulating layer 201 may be formed on the sidewalls of the second portions 113_2 of the third fin type pattern 113 and the second portions 114_2 of the fourth fin type pattern 114.

The fourth gate electrode 203 may be formed on the fourth gate insulating layer 201. The fourth gate electrode 203 may cover the first portion 113_1 of the third fin type pattern 113 and the first portion 114_1 of the fourth fin type pattern 114.

The third hard mask 205 may be formed on the fourth gate electrode 203.

A nitriding process NP may be carried out on the portion of the field insulating layer 120 exposed by the fourth gate structure 200, the second portions 113_2 of the third fin type pattern 113, the second portions 114_2 of the fourth fin type pattern 114, the upper surface of the fourth gate structure 200, and side walls 200S1 and 200S2 of the fourth gate structure 200.

The first barrier layer 150a may be formed in the first region R1 of the field insulating layer 120. That is, even though the shape of the channel region is different from that of FIG. 1, the first region R1 of the field insulating layer 120 may include the first barrier layer 150a. The second barrier layer 150b may be formed on the upper surface of the fourth gate structure 200 and on both side walls 200S1 and 200S2 of the fourth gate structure 200. The third barrier layer 150c may be formed on the upper surface of the second portions 113_2 of the third fin type pattern 113 and on the upper surface of the second portions 114_2 of the fourth fin type pattern 114. That is, even though the shape of the channel region is different from that of FIG. 1, the portion of the fin type patterns overlapping with the gate spacer may include the third barrier layer 150c. The fourth barrier layer 150d may be formed on the side walls of the second portions 113_2 of the third fin type pattern 113 and on the side walls of the second portions 114_2 of the fourth fin type pattern 114.

While the present inventive concepts has been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for fabricating a semiconductor device, the method comprising:
    forming a fin type pattern protruding from a substrate and extending in a first direction;
    forming a field insulating layer covering a limited portion of the fin type pattern on the substrate, such that the field insulating layer exposes a separate limited portion of the fin type pattern;
    forming a gate structure on the field insulating layer and the fin type pattern, the gate structure extending in a second direction, the second direction different from the first direction;
    forming a first barrier layer in a first region of the field insulating layer subsequently to forming the gate structure, the first region exposed by the gate structure, the first region is adjacent to the gate structure and extending in the second direction, the first barrier layer including a nitrogen element; and
    forming a gate spacer on the first barrier layer and on a side wall of the gate structure, subsequently to forming the first barrier layer, such that the first barrier layer is formed subsequently to forming the gate structure and prior to forming the gate spacer.

2. The method of claim 1, further comprising:
    forming a second barrier layer on the side wall of the gate structure, the second barrier layer including the nitrogen element,
    wherein the gate spacer is formed on the second barrier layer, such that the second barrier layer is between the gate spacer and the side wall of the gate structure.

3. The method of claim 2, wherein the first barrier layer and the second barrier layer are formed simultaneously.

4. The method of claim 2, wherein
    the first barrier layer includes silicon oxynitride, and
    the second barrier layer includes silicon nitride.

5. The method of claim 1, further comprising:
    forming a third barrier layer on an upper surface and side walls of the fin type pattern exposed by the gate structure, the third barrier layer formed prior to forming the gate spacer, the third barrier layer including the nitrogen element.

6. The method of claim 5, wherein the third barrier layer includes silicon nitride.

7. The method of claim 1, wherein at least a part of the first barrier layer is formed in an upper portion of the field insulating layer, the upper portion of the field insulating layer including an upper surface of the field insulating layer.

8. The method of claim 7, wherein a concentration of the nitrogen element in the first region of the field insulating layer decreases from the upper surface of the field insulating layer to a lower surface of the field insulating layer.

9. A method for fabricating a semiconductor device, the method comprising:
    forming a fin type pattern protruding from a substrate and extending in a first direction;
    forming a field insulating layer covering a limited portion of the fin type pattern on the substrate, such that the field insulating layer exposes a separate limited portion of the fin type pattern;
    forming a gate structure on the field insulating layer and the fin type pattern, the gate structure extending in a second direction, the second direction different from the first direction;
    causing a first region of the field insulating layer to include a nitrogen element subsequently to forming the gate structure; and
    forming a gate spacer on the first region of the field insulating layer and a side wall of the gate structure, subsequently to causing the first region of the field insulating layer to include the nitrogen element, such that
    the first region is caused to include the nitrogen element subsequently to forming the gate structure and prior to forming the gate spacer on the first region, and
    the first region overlaps with the gate spacer.

10. The method of claim 9, wherein a concentration of the nitrogen element in the first region of the field insulating layer decreases from an upper surface of the field insulating layer to a lower surface of the field insulating layer.

11. The method of claim 9, wherein
    the side wall of the gate structure includes a first side wall and a second side wall, the first and second side walls opposed to each other, and
    a concentration of the nitrogen element in a portion of the gate structure that is adjacent to a central point between the first side wall and the second side wall is less than both
        a concentration of the nitrogen element in a portion of the gate structure that is adjacent to the first side wall, and
        a concentration of the nitrogen element in a portion of the gate structure that is adjacent to the second side wall.

12. The method of claim 9, wherein a concentration of the nitrogen element in the first region of the field insulating layer is higher at an upper portion of the field insulating layer than at a lower portion of the field insulating layer.

13. The method of claim 9, wherein
    the fin type pattern includes a region overlapping with the gate spacer, and
    an upper portion of the fin type pattern includes the nitrogen element in the region overlapping with the gate spacer.

14. The method of claim 9, further comprising:
    performing a nitriding process on the fin type pattern, the field insulating layer and the gate structure prior to forming the gate spacer.

15. The method of claim 9, further comprising:
    forming a semiconductor pattern on the fin type pattern subsequently to forming the gate spacer; and
    removing the gate structure.

16. The method of claim 9, wherein the forming the gate structure comprises forming a gate structure layer on the field insulating layer and the fin type pattern, and patterning the gate structure layer to form the gate structure.

* * * * *